(12) United States Patent
Su et al.

(10) Patent No.: US 12,543,326 B2
(45) Date of Patent: Feb. 3, 2026

(54) DEEP TRENCH CAPACITOR AND METHODS OF FORMING THE SAME

(71) Applicant: TAIWAN SEMICONDUCTOR MANUFACTURING COMPANY, LTD., Hsinchu (TW)

(72) Inventors: Shu-Hui Su, Taipei (TW); Hsin-Li Cheng, Hsinchu (TW); Felix YingKit Tsui, Cupertino, CA (US); Yu-Chi Chang, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 613 days.

(21) Appl. No.: 17/882,794

(22) Filed: Aug. 8, 2022

(65) Prior Publication Data

US 2024/0047513 A1  Feb. 8, 2024

(51) Int. Cl.
| | | |
|---|---|---|
| *H10D 1/00* | (2025.01) | |
| *H01L 21/764* | (2006.01) | |
| *H01L 21/768* | (2006.01) | |
| *H01L 23/522* | (2006.01) | |
| *H01L 23/58* | (2006.01) | |
| *H10D 1/68* | (2025.01) | |

(52) U.S. Cl.
CPC ............ *H10D 1/042* (2025.01); *H01L 21/764* (2013.01); *H01L 21/76816* (2013.01); *H01L 23/5223* (2013.01); *H01L 23/585* (2013.01); *H10D 1/696* (2025.01); *H10D 1/716* (2025.01)

(58) Field of Classification Search
CPC ........ H10D 1/042; H10D 1/716; H10D 1/696; H01L 21/764; H01L 21/76816; H01L 23/5223; H01L 23/585
See application file for complete search history.

(56) References Cited

U.S. PATENT DOCUMENTS

| 10,074,618 B1 * | 9/2018 | Chen ....................... H01L 24/19 |
| 11,063,157 B1 | 7/2021 | Cheng et al. |
| 11,296,065 B2 | 4/2022 | Jeng et al. |

(Continued)

*Primary Examiner* — Nathan W Ha
(74) *Attorney, Agent, or Firm* — NZ Carr Law Office

(57) ABSTRACT

Various embodiments of the present disclosure provide a semiconductor device structure. The semiconductor device structure comprises a substrate comprising a first trench, wherein the first trench extends into a front side surface of the substrate, a first trench capacitor comprising a plurality of first capacitor electrode layers and a plurality of first capacitor dielectric layers disposed in alternating manner within the first trench and over the front side surface of the substrate, wherein a first air gap is enclosed by the plurality of first capacitor electrode layers and the plurality of first capacitor dielectric layers within the first trench, an interconnect structure disposed over the first trench capacitor, wherein one or more first capacitor electrode layers of the plurality of first capacitor electrode layers are in electrical connection with a first conductive feature in a dielectric layer of the interconnect structure, and a first seal ring structure disposed in the interconnect structure and encircling an interior portion of the substrate, wherein at least a portion of the first seal ring structure is in contact with the first conductive feature.

20 Claims, 26 Drawing Sheets

(56) References Cited

U.S. PATENT DOCUMENTS

| | | | | |
|---|---|---|---|---|
| 2009/0108409 | A1* | 4/2009 | Tsutsue | H01L 23/585 |
| | | | | 257/E21.585 |
| 2013/0320459 | A1* | 12/2013 | Shue | H10D 84/038 |
| | | | | 438/296 |
| 2014/0291767 | A1* | 10/2014 | Lee | H01L 21/764 |
| | | | | 438/422 |
| 2016/0020181 | A1* | 1/2016 | Yu | H01L 23/3171 |
| | | | | 257/737 |
| 2018/0047680 | A1* | 2/2018 | Uchida | H10D 62/115 |
| 2018/0269161 | A1* | 9/2018 | Wu | H01L 23/564 |
| 2019/0198453 | A1* | 6/2019 | Sekikawa | H01L 23/562 |
| 2019/0295964 | A1* | 9/2019 | Chen | H01L 24/96 |
| 2019/0363079 | A1* | 11/2019 | Thei | H01L 24/89 |
| 2020/0176552 | A1* | 6/2020 | Chang | H10D 1/665 |
| 2021/0036097 | A1* | 2/2021 | Tsai | H01L 24/25 |
| 2021/0098392 | A1* | 4/2021 | Wu | H10F 39/024 |
| 2021/0125910 | A1* | 4/2021 | Shih | H01L 25/0657 |
| 2021/0313246 | A1* | 10/2021 | Matsumura | H10B 43/40 |
| 2022/0102482 | A1 | 3/2022 | Tsai et al. | |
| 2022/0165664 | A1* | 5/2022 | Chang | H01L 23/585 |
| 2022/0367406 | A1* | 11/2022 | Chang | H01L 25/50 |
| 2023/0041160 | A1* | 2/2023 | Huang | H01L 23/564 |
| 2023/0066360 | A1* | 3/2023 | Chen | H01L 23/10 |
| 2024/0030359 | A1* | 1/2024 | Su | H10B 12/038 |
| 2024/0038684 | A1* | 2/2024 | Tsai | H01L 23/544 |
| 2024/0047383 | A1* | 2/2024 | Chang | H01L 23/562 |
| 2024/0372014 | A1* | 11/2024 | Kuo | H10D 1/047 |

* cited by examiner

DEEP TRENCH CAPACITOR AND METHODS OF FORMING THE SAME

BACKGROUND

Deep trench capacitors provide high capacitance density without increasing the surface area of the capacitor structure contributed by the semiconductor substrate, and may be used as charge storage devices for memory cells, passive components for radio frequency circuits in various integrated circuits, or as decoupling devices to improve stable voltage supply in integrated circuits.

Deep trench capacitors are usually designed to possess a high aspect ratio in order to achieve a high density layout. However, as the chips are made progressively thinner, the rigidity and robustness of the wafer containing the chips may be more vulnerable to damage or warpage since the wafers along with embedded features fail to provide sufficient resistance to stress. Therefore, an improved structure and manufacturing method of deep trench capacitors are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1I illustrate cross-sectional views of various processing steps of manufacturing a first semiconductor device structure having a trench capacitor, in accordance with various embodiments of this disclosure.

FIG. 1J-2 illustrates a schematic top view of a portion of a semiconductor device structure having multiple trench capacitors, in accordance with some alternative embodiments.

FIG. 1J-3 illustrates a schematic top view of a portion of a semiconductor device structure having multiple trench capacitors, in accordance with some alternative embodiments.

FIG. 1J-4 illustrates a schematic top view of a portion of a semiconductor device structure having multiple trench capacitors, in accordance with some alternative embodiments.

FIGS. 1K-1O illustrate cross-sectional views of various processing steps of manufacturing a multi-wafer structure with a high capacitance density and low substrate warpage, in accordance with some embodiments of this disclosure.

FIGS. 2-5 illustrate cross-sectional views of a semiconductor device structure having a trench capacitor with different dimension of air gap, in accordance with some alternative embodiments.

DETAILED DESCRIPTION

Figure 1A:
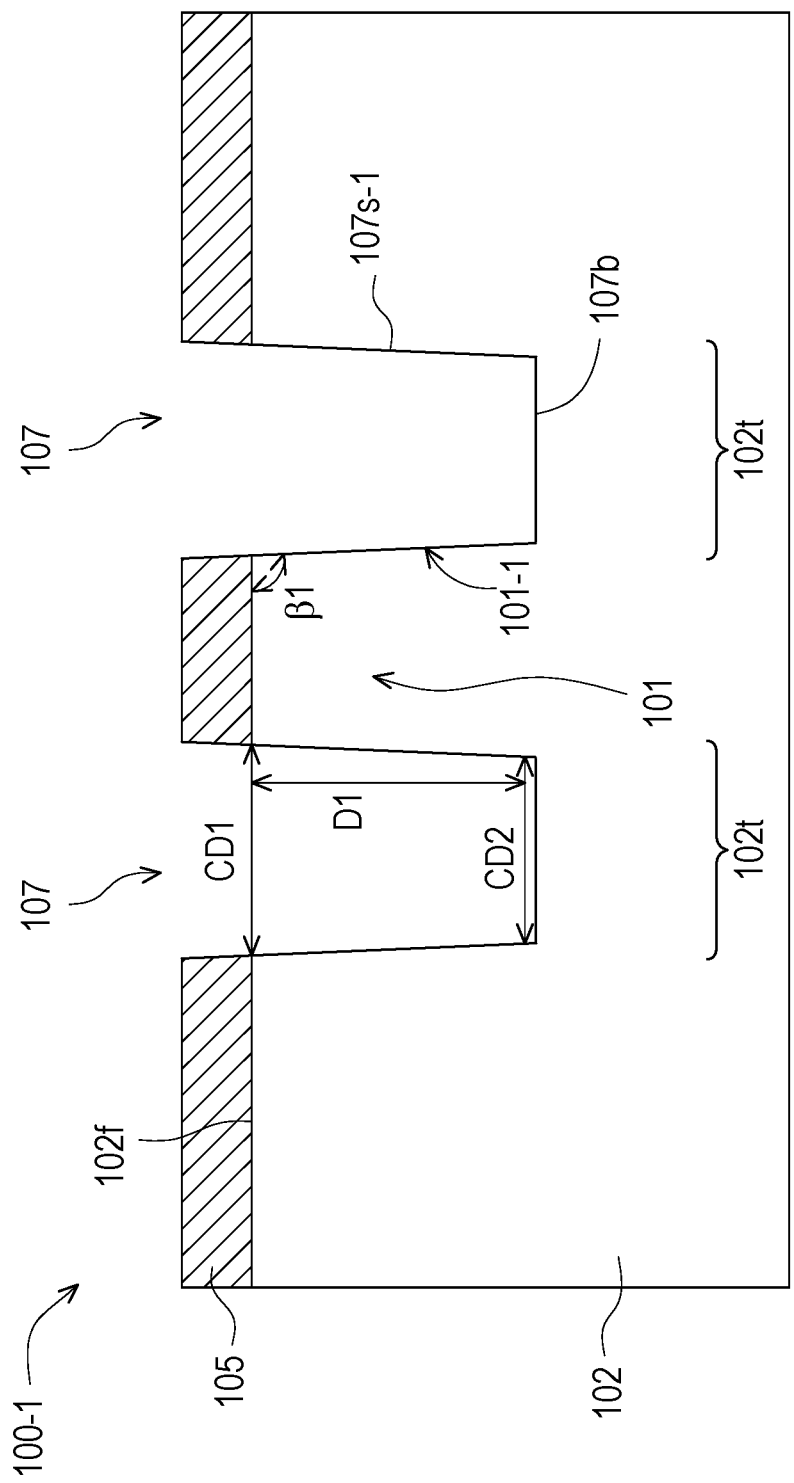

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices may include a number of active devices such as a trench capacitor disposed within and/or over a semiconductor substrate. For example, the substrate may include a plurality of trenches defined by a bottom and sidewalls extending from the bottom. The semiconductor substrate may include a plurality of substrate pillars such that a substrate pillar laterally separates adjacent trenches from one another. The trench capacitor includes multiple electrodes and one or more dielectric layers alternatingly stacked in each of the plurality of trenches. Each electrode continuously extends across each trench in the plurality of trenches and continuously extends along sidewalls of the substrate pillars. A capacitance density of the trench capacitor may be increased by increasing the number of trenches disposed within the substrate. This is because a surface area between adjacent electrodes is increased as the number of trenches increases.

A challenge with the trench capacitor is a physical stress in the semiconductor substrate as the number of trenches increases. For example, during fabrication of the trench capacitor, an etch process is performed on the semiconductor substrate to define the plurality of substrate pillars and the plurality of trenches. The etch process is configured such that the substrate pillars respectively include substantially straight opposing sidewalls. Deposition processes are performed to define the plurality of electrodes and dielectric layers within the trenches such that the electrodes and dielectric layers completely fill each trench. This, in part, is because the electrodes and dielectric layers conform to the substantially straight opposing sidewalls of the substrate pillars. However, during the fabrication process and/or operation of the trench capacitor, the electrodes and dielectric layers are exposed to heat (e.g., due to baking process (es) and/or heat generated by high voltages and/or currents). The heat causes the dielectric layers and/or the electrodes to undergo thermal expansion. Because the trenches are completely filled, the expansion of the aforementioned layers applies force against surfaces of the substrate defining the trenches. This may lead to wrapping, breaking, and/or cracking of the semiconductor substrate, resulting in device failure. As the trench densities increase due to smaller process nodes, the foregoing issues are expected to become more prominent. Various embodiments of the present disclosure are directed towards a trench capacitor with a high capacitance density and low substrate warpage, and methods for forming the trench capacitor. Particularly, the trench capacitors are made with a unique profile such that an air gap is formed within each trench and enclosed by a plurality of capacitor electrode layers and dielectric layers. In some embodiments, the capacitance density is further increased by multi-wafer stacking.

FIGS. 1A-1I illustrate cross-sectional views of various processing steps of manufacturing a first semiconductor device structure 100-1 having a trench capacitor, in accordance with various embodiments of this disclosure. It is understood that additional operations can be provided before, during, and after processes shown by FIGS. 1A-1I and some of the operations described below can be replaced or eliminated, for additional embodiments of the method. The order of the operations/processes may be interchangeable. As shown in FIG. 1A, a semiconductor substrate 102 is provided and is subsequently patterned to define at least a portion of trenches 102t and a pillar structure 101 within the semiconductor substrate 102. In some embodiments, the semiconductor substrate 102 may be or comprise a bulk substrate (e.g., a bulk silicon substrate) or a silicon-on-insulator (SOI) substrate. Before performing the patterning process, a masking layer 105 is formed over the front side surface 102f of the semiconductor substrate 102. The masking layer 105 may be a multi-layer structure including one or more hard mask layers, a dielectric layer, an anti-reflection coating (ARC) layer, and a photoresist, and may be deposited by any suitable deposition techniques such as chemical vapor deposition (CVD), physical vapor deposition (PVD), atomic layer deposition (ALD), etc. The masking layer 105 is patterned to define openings within the masking layer 105 and expose the front side surface 102f of the semiconductor substrate 102. The semiconductor substrate 102 is then patterned according to the masking layer 105 to define at least a portion of trenches 102t within the semiconductor substrate 102.

In some embodiments, two or more openings 107 are formed in the semiconductor substrate 102. Each opening 107 has a first critical dimension CD1 measuring at the front side surface 102f of the semiconductor substrate 101 (e.g., the top of the opening 107), a second critical dimension CD2 measuring at the bottom 107b of the opening 107, and a depth D1. The depth D1 is defined from the front side surface 102f of the semiconductor substrate 102 to the bottom 107b of the openings 107. The openings 107 may be formed by one or more etch processes, which may be a dry etch, wet etch, or a combination thereof. In some embodiments, the openings 107 are formed by one or more dry etch processes using a halogen-based chemistry. The one or more dry etch processes are performed such that the first critical dimension CD1 is greater than the second critical dimension CD2, and the openings 107 are formed with angled first sidewalls 107s-1. The first critical dimension CD1 may be in a range from about 200 nm to about 400 nm, and the depth D1 may be about 10 μm or above, such as about 12 μm to about 30 μm. Particularly, the first sidewalls 107s-1 of the openings 107 (or sidewalls 101-1 of the pillar structure 101) and a horizontal line aligned with the front side surface 102f of the semiconductor substrate 102 form an angle θ1 of about 92 degrees or greater, for example about 95 degrees to about 110 degrees. If the angle θ1 is less than about 92 degrees, the subsequent capacitor electrode layers 110a-d and the capacitor dielectric layers 112a-d on opposing sidewalls 107s-1 may not contact or merge to enclose an air gap in each trench 102t, leading mitigation of warpage or breaking of the semiconductor substrate 102 to fail.

Figure 1B:
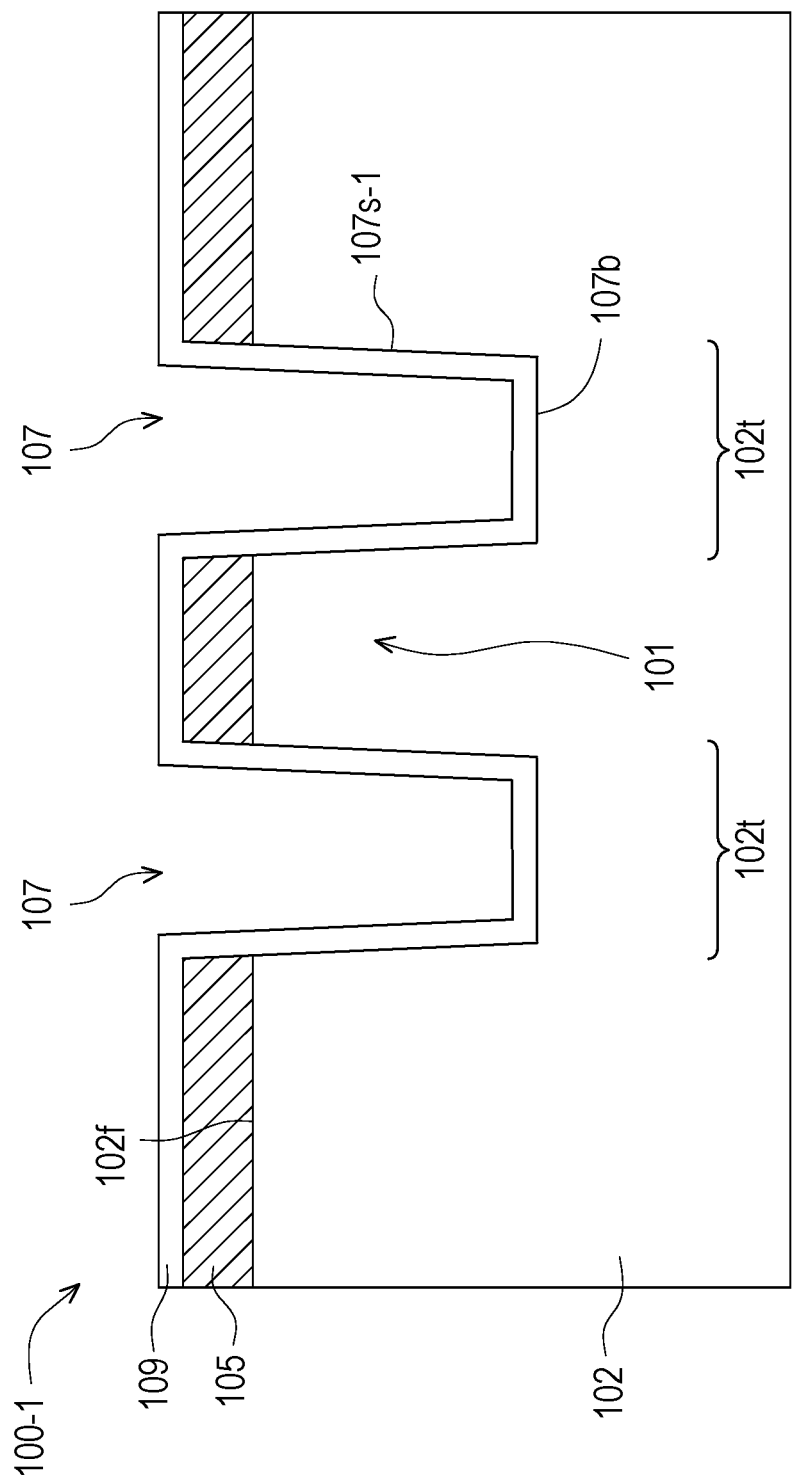

As shown in FIG. 1B, a protection layer 109 is formed on the exposed surfaces of the masking layer 105 and the openings 107. The protection layer 109 prevents the patterned masking layer 105 from being damaged during the subsequent etch processes. The protection layer 109 may include a material having different etch selectivity than the material of the semiconductor substrate 102. In some embodiments, the protection layer 109 is a polymer, such as a $CF_x$ based polymer. In such cases, the protection layer 109 may be formed by a plasma polymerization process using fluorine-containing precursors (e.g., $CHF_3$, $C_2F_4$, etc.). Alternatively, the protection layer 109 may be a semiconductor material, such as amorphous silicon, or an oxide, such as silicon oxide or any suitable dielectric material. In any case, the protection layer 109 may be a conformal layer having a thickness less than about 5 nm, such as from about 1 nm to about 5 nm.

Figure 1C:
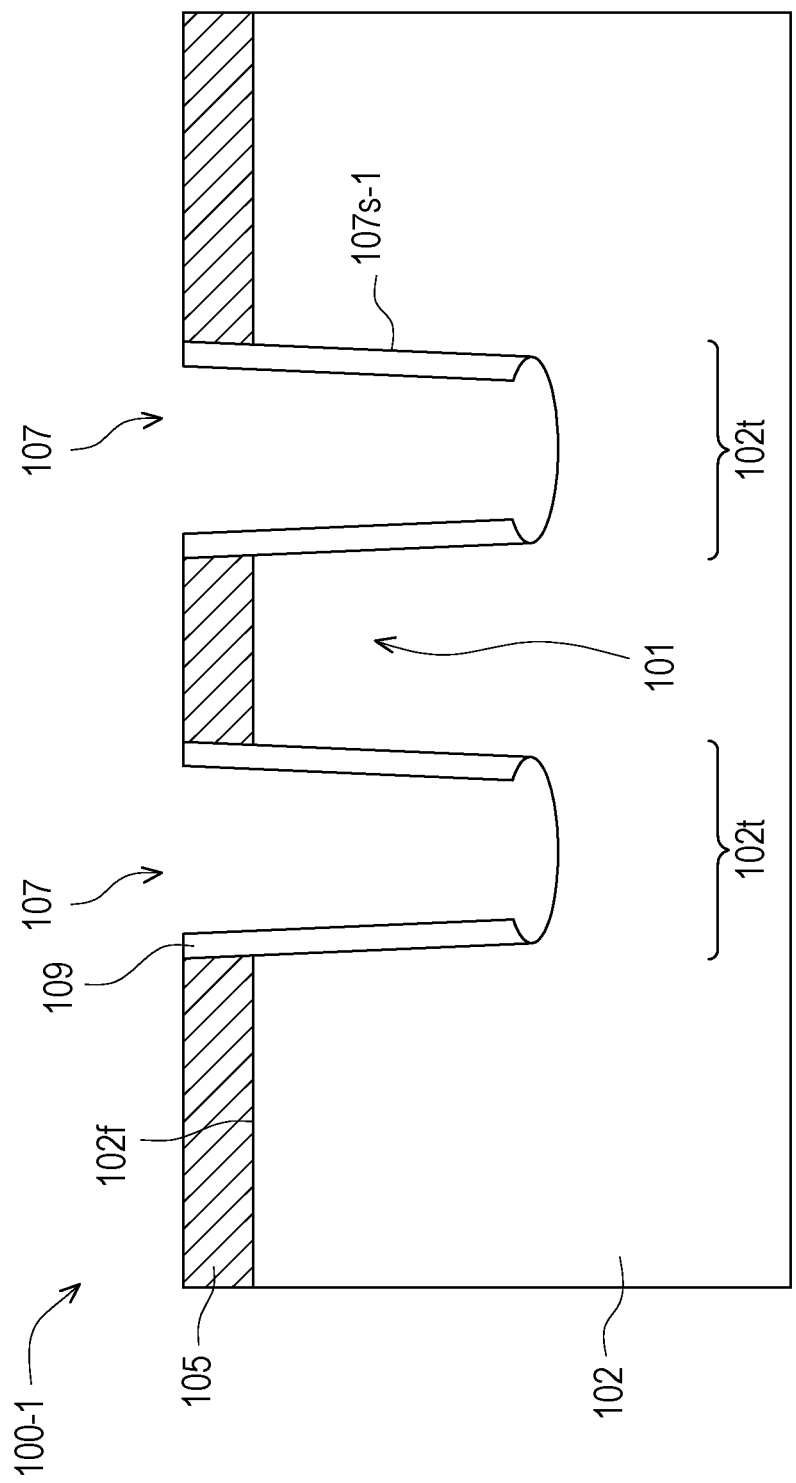

As shown in FIG. 1C, an anisotropic etch process may be performed to remove portions of the protection layer 109 disposed on horizontal surfaces. For example, the portions of the protection layer 109 formed on the top surface of the masking layer 105 and on the bottom 107b of the openings 107 are removed. In some embodiments, the anisotropic etch process may overetch a portion of the bottom 107b of the openings 107 so that the openings 107 is further extended with a concave profile formed at the bottom of the openings 107. As a result of the anisotropic etch process, the remaining portions of the protection layer 109 are disposed on sidewalls of the masking layer 105 and first sidewalls 107s-1 in the openings 107.

Figure 1D:
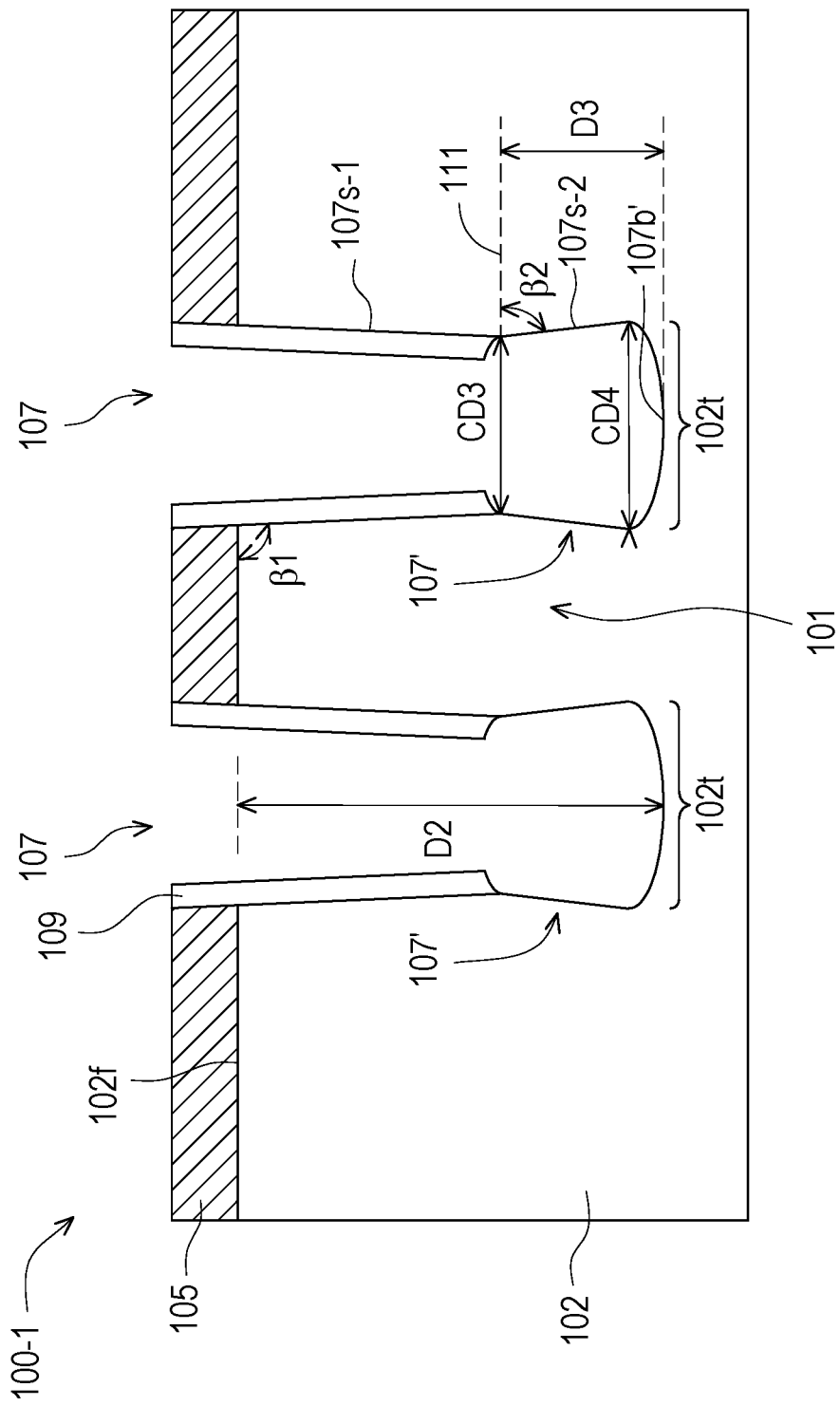

As shown in FIG. 1D, one or more etch processes are performed to extend the openings 107 to a depth D2 substantially greater than the depth D1. The depth D2 is a combined height of the opening 107 and the extended opening 107', and is measured from the front side surface 102f of the semiconductor substrate 102 to the bottom 107b' of the extended openings 107'. In some embodiments, the depth D2 is about 10 μm to about 35 μm. The remaining portions of the protection layer 109 protect the first sidewalls 107s-1 of the openings 107 during the one or more etch processes. The remaining portions of the protection layer 109 ensure the critical dimensions (e.g., CD1 and CD2) are not substantially changed during the one or more etch processes.

As a result of the one or more etch processes, the openings 107 are expanded with angled second sidewalls 107s-2 that extend downwardly from the first sidewalls 107s-1. The second sidewalls 107s-2 of the openings 107 and a horizontal line 111 form an angle β2. The horizontal line 111 is aligned with a point where the first sidewall 107s-1 and second sidewall 107s-2 meet and parallel with the front side surface 102f of the semiconductor substrate 102. In various embodiments, the angle β2 is lesser than the angle β1. In some embodiments, the angle β2 is about 70 degrees or greater, such as about 75 degrees to about 85 degrees. The extended openings 107' have a third critical dimension CD3 that is substantially the same or slightly larger than the second critical dimension CD2 of the openings 107 (FIG. 1A), and a fourth critical dimension CD4 that is greater than the third critical dimension CD3. The one or more etch process may be performed at a pressure lower than that of the one or more dry etch processes used for forming the openings 107. The extended openings 107' are formed with a concave profile formed at the bottom of the extended openings 107'. In some embodiments, the extended openings 107' have a depth D3 measuring from the horizontal line 111 to the bottom 107b' of the extended openings 107', and the depth D3 may be within a range of about 25 percent to about 85 percent of the depth D2.

Figure 1E:
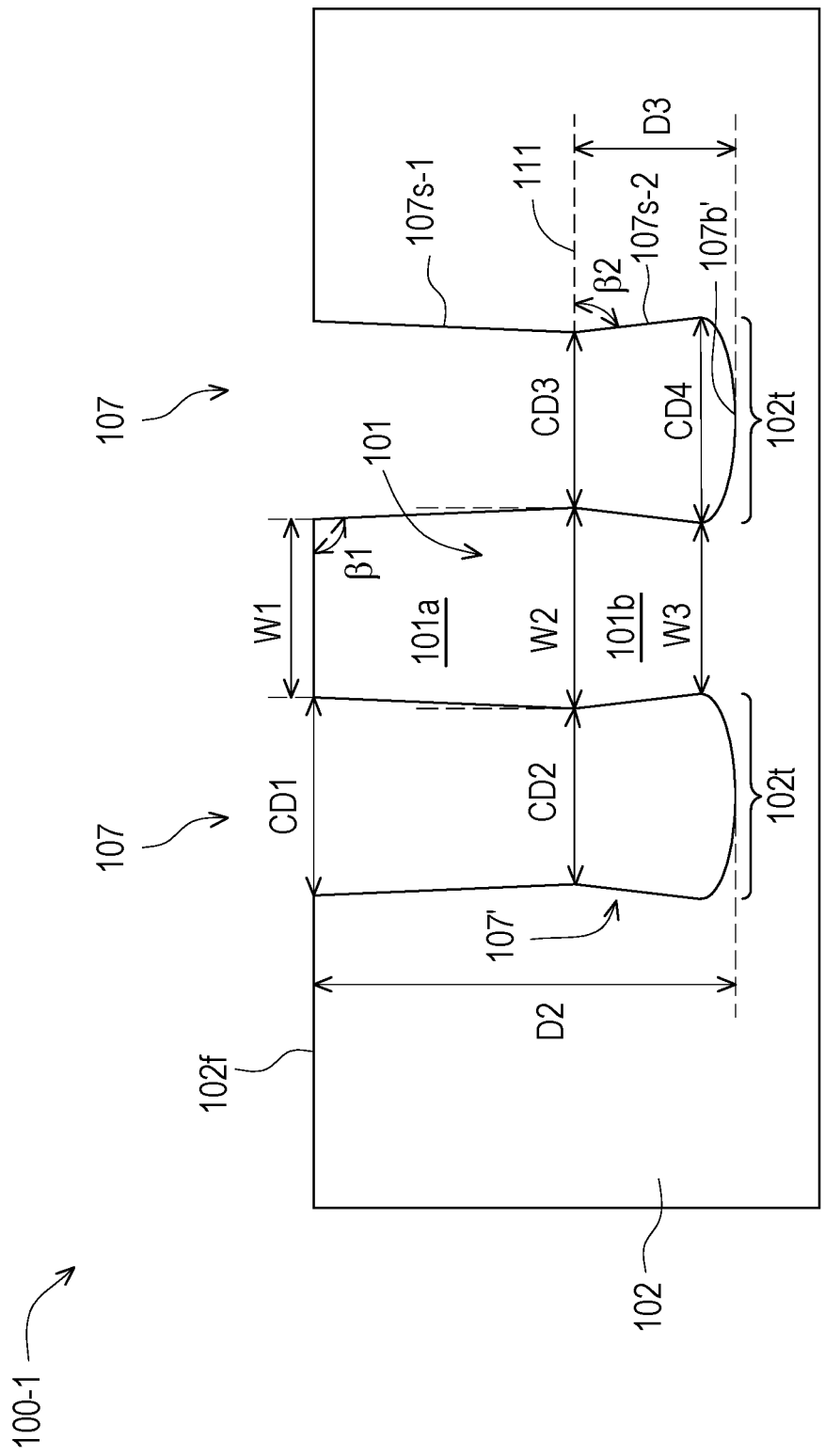

As shown in FIG. 1E, the remaining portions of the protection layer 109 are removed by an ashing process and/or selective etch process, which may be a wet etch or any suitable removal process. The selective etch process removes the protection layer 109 and the masking layer 105 but does not substantially affect the semiconductor substrate 102. The combination of the openings 107 and extended openings 107' defines the trenches 102t in the semiconductor substrate 102. Therefore, the trenches 102t as formed have critical dimensions, sidewall angles, and bottom profile that are identical or substantially identical to those discussed above with respect to the openings 107 and extended openings 107'. In some embodiments, the trenches 102t may each have an aspect ratio (i.e., a ratio of height to width) of about 30:1 to about 50:1.

Figure 1F:
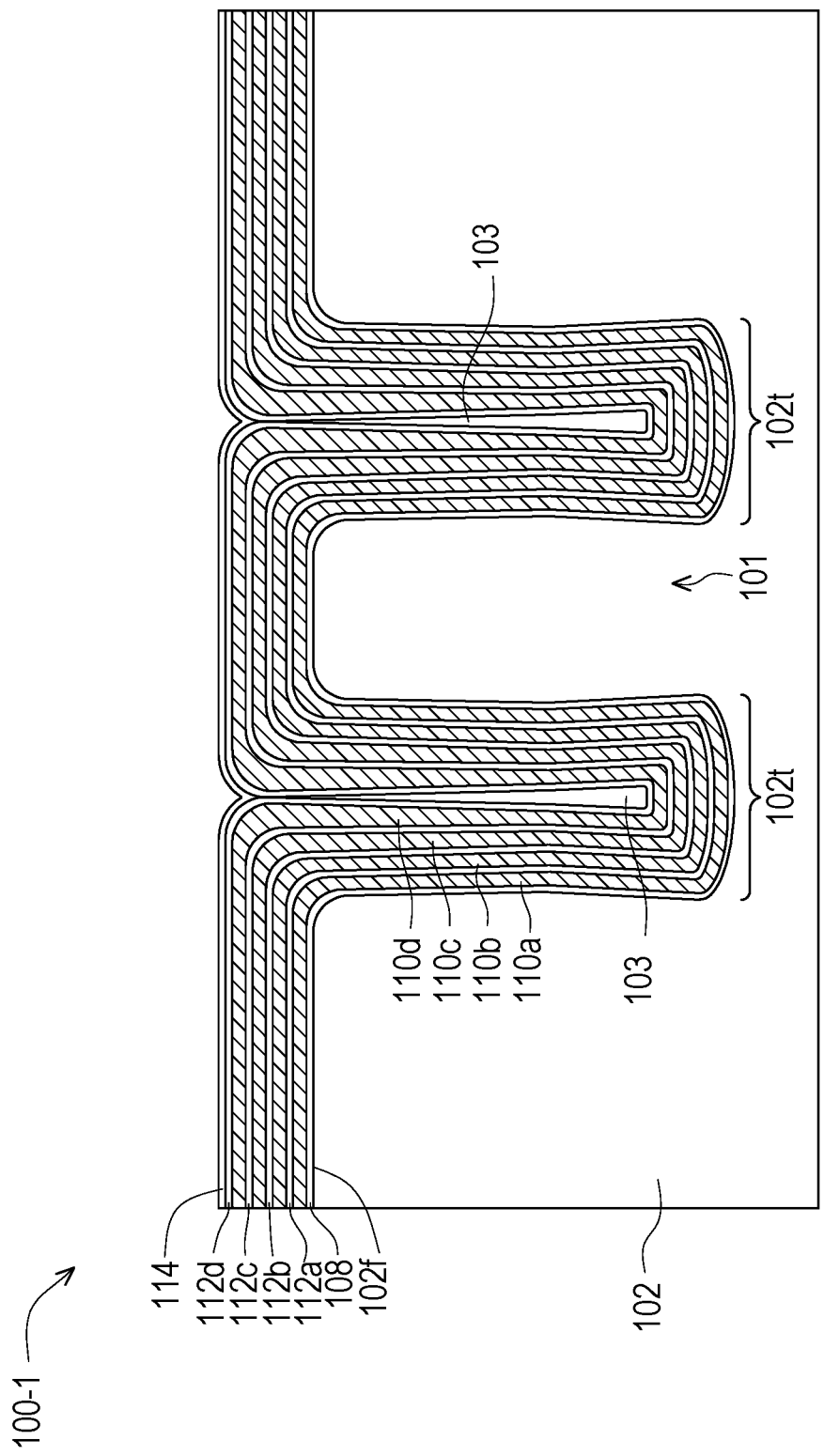

The pillar structure 101 disposed between and abutting two adjacent trenches 102t has a profile in accordance with the profile of the trenches 102t. In some embodiments, the pillar structure 101 has a first width W1 measuring at an elevation of the front side surface 102f of the semiconductor substrate 102, a second width W2 measuring at an elevation of the horizontal line 111, and a third width W3 measuring at an elevation adjacent to the bottom 107b' of the extended opening 107'. As can be seen in FIG. 1E, the pillar structure 101 generally includes an upper portion 101a and a lower portion 101b, where the upper portion 101a has a dimension gradually increasing from the first width W1 to the second width W2, and the lower portion 101b has a dimension gradually decreasing from the second width W2 to the third width W3. In various embodiments, the second width W2 is greater than the first width W1 and the third width W3. In some embodiments, the first width W1 is greater than the third width W3. In some embodiments, the first width W1 is less than the third width W3. The second portion 101b may have a height that is within a range of about 25 percent to about 40 percent (e.g., about 35 percent) of the height of the first portion 101a. The pillar structure 101 with different widths ensures that an air gap (e.g., air gap 103 as shown in FIG. 1F) will exist in each of the trenches 102t. For example, during manufacturing of the trench capacitor 106 (FIG. 1G), the capacitor electrode layers 110a-d (FIG. 1F) and the capacitor dielectric layers 112a-d (FIG. 1F) are deposited (by one or more ALD processes) such that they will conform to a shape or profile of the pillar structure 101. Since the second width W2 of the pillar structure 101 is greater than the first and third widths W1 and W3 of the pillar structure 101, the third critical dimension CD3 of the trenches 102t is narrower than the first and third critical dimensions CD1 and CD3 of the trenches 102t, resulting in the subsequent capacitor electrode layers 110a-d and the capacitor dielectric layers 112a-d on opposing sidewalls 107s-1 and 107s-2 to contact or merge prematurely at or adjacent the second critical dimension CD2 of the trenches 102t. As a result, the air gap 103 is formed in each trench 102t after depositing the capacitor electrode layers 110a-d and the capacitor dielectric layers 112a-d.

By virtue of the profile of the pillar structure 101, the capacitor electrode layers 110a-d and capacitor dielectric layers 112a-d may be formed in such a manner that an air gap 103 is formed in each trench 102t. The presence of the air gaps 103 allows the capacitor electrode layers 110a-d and capacitor dielectric layers 112a-d to expand into the air gaps 103 while undergoing thermal expansion during the fabrication process and/or operation of the trench capacitor, which mitigates warpage, cracking, and/or breaking of the semiconductor substrate 102. This in part increases the number of trenches 102t that may be formed within the semiconductor substrate 102, thereby increasing the capacitor density of the trench capacitor 106 while decreasing substrate warpage.

It is contemplated that various process conditions, such as the chamber pressure, processing time, and power used during one or more etch processes, may be adjusted to control the first, second, third, and fourth critical dimensions CD1-CD4, the angles β1 and β2 of the sidewalls 107s-1, 107s-2, as well as the depths D2, D3 of the openings 107 and extended openings 107', which in turn controls the size or dimension of air gap 103 in each trench 102t. As will be discussed in more detail below with respect to FIGS. 2-5, various dimensions of the air gaps 203, 303, 403, 503 can be formed in each trench 102t through the tuning of the process conditions, thereby mitigating warpage, cracking, and/or breaking of the semiconductor substrate 102 and increasing the capacitor density of the trench capacitor.

As shown in FIG. 1F, an insulator layer 108 is formed along the front side surface 102f of the semiconductor substrate 102 and sidewalls 107s-1, 107s-2 of the openings 107 and extended openings 107' defining the trenches 102t. In some embodiments, the insulator layer 108 may be or include an oxide, such as silicon oxide, or other suitable dielectric material, and may be formed to have a thickness in a range of about 250 Angstroms to about 900 Angstroms. The insulator layer 108 may be deposited by CVD, PVD, thermal oxidation, or other suitable growth or deposition techniques. Subsequently, a plurality of capacitor electrode layers 110a-d and a plurality of capacitor dielectric layers 112a-d are formed within the trenches 102t of the semiconductor substrate 102 in alternating manner. The capacitor electrode layers 110a-d and the capacitor dielectric layers 112a-d are formed such that they conform to sidewalls of the pillar structure 101 and sidewalls of the openings 107 and extended openings 107' that define the trenches 102t, thereby defining an air gap 103 within each trench 102t. In some embodiments, the air gap 103 is defined between sidewalls of an uppermost capacitor dielectric layer 112d. Next, a capping dielectric layer 114 may be formed over the uppermost capacitor dielectric layer 112d. The capacitor electrode layers 110a-d and the capacitor dielectric layers 112a-d, and the capping dielectric layer 114 may be formed by ALD, CVD, PVD, or any suitable deposition technique. In one embodiment, the capacitor electrode layers 110a-d and the capacitor dielectric layers 112a-d are conformal layers deposited by ALD processes. While four layers of the capacitor electrode layers 110a-d and four layers of the capacitor dielectric layers 112a-d are shown, more or less layers are contemplated. In some embodiments, the capping dielectric layer 114 is formed such that it extends within each trench 102t and seals the air gaps 103. Therefore, the capping dielectric layer 114 may continuously extend along an upper surface of an uppermost capacitor dielectric layer 112d. In such embodiments, each air gap 103 is defined between inner sidewalls of the capping dielectric layer 114.

During subsequent processing steps, the capacitor electrode layers 110a-d and/or the capacitor dielectric layers 112a-d may be exposed to high heat (e.g., by thermal annealing process(es)). The high heat may result in thermal expansion of the capacitor electrode layers 110a-d and capacitor dielectric layers 112a-d such that aforementioned layers may expand into the air gap 103. This, in part, mitigates force applied to the semiconductor substrate 102 and/or pillar structure 101 when the capacitor electrode layers 110a-d and capacitor dielectric layers 112a-d expand. Therefore, cracking, warping, and/or breaking of the semiconductor substrate 102 and/or the pillar structure 101 may be reduced.

Figure 1G:
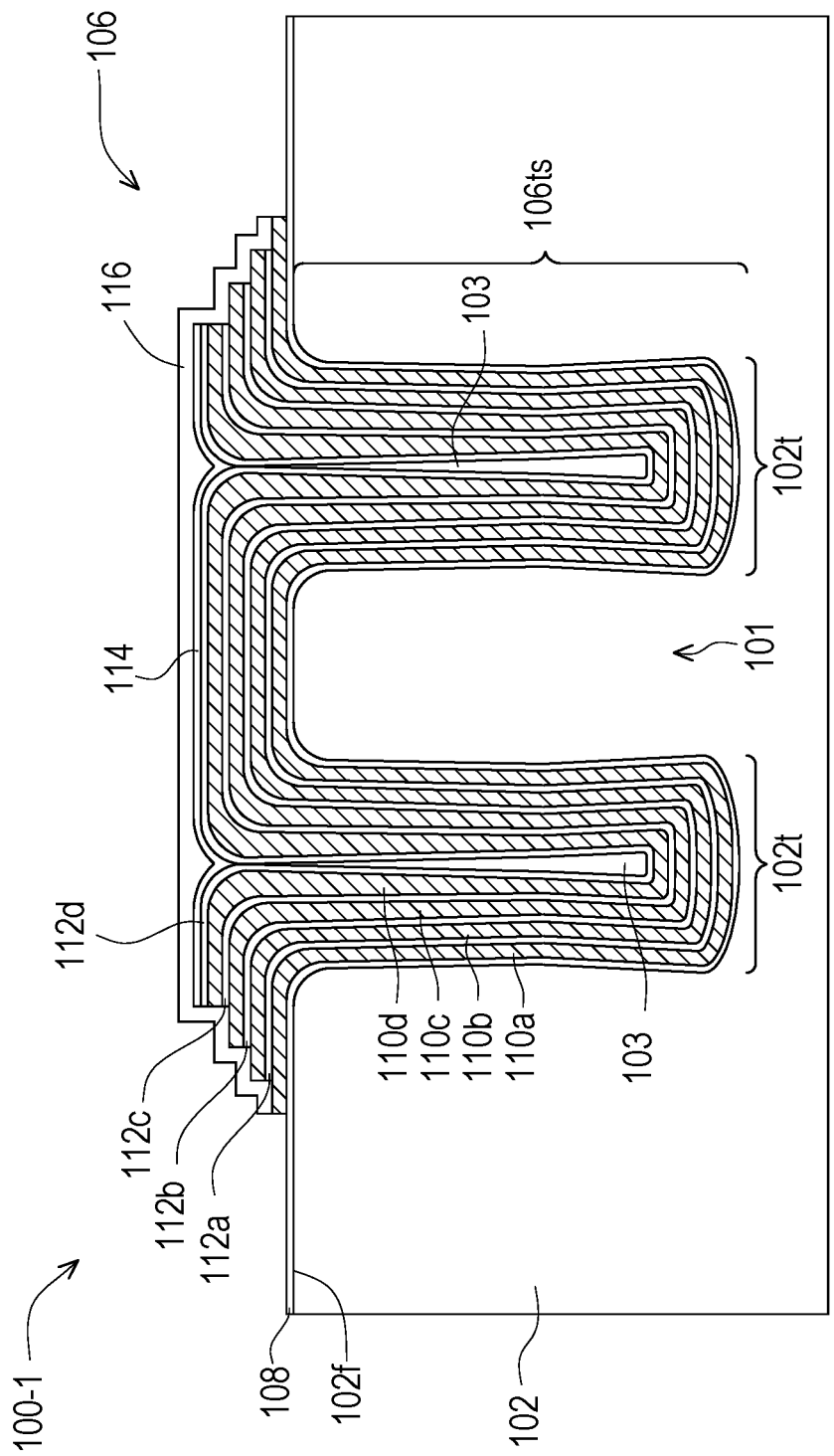

As shown in FIG. 1G, the capacitor electrode layers 110a-d and/or capacitor dielectric layers 112a-d are patterned, thereby defining a trench capacitor 106. The trench capacitor 106 has trench segments 106ts that fill a corresponding trench 102t. The trench segments 106ts of the trench capacitor 106 conform to sidewalls of the openings 107 and extended openings 107' (FIG. 1E) that define the pillar structure 101. In some embodiments, a process for patterning each capacitor electrode layer 110a-d and/or capacitor dielectric layer 112a-d may include: forming a masking layer (not shown) over the target capacitor electrode layer and/or capacitor dielectric layer; exposing unmasked regions of the target capacitor electrode layer and/or capacitor dielectric layer to one or more etchants, thereby reducing a width of the target layer(s); and performing a removal process (e.g., a wet etch process) to remove the masking layer. For example, a first patterning process according to a first masking layer (not shown) may be performed on a first capacitor electrode layer 110a, a second patterning process according to a second masking layer (not shown) may be performed on a second capacitor electrode layer 110b and a first capacitor dielectric layer 112a, and additional patterning processes may be performed for the remaining capacitor layers until the trench capacitor 106 is formed. In some embodiments, an etch stop layer 116 may be formed over an upper surface of the trench capacitor 106 by CVD, PVD, ALD, or any suitable growth or deposition process. The etch stop layer 116 may be or include silicon nitride, silicon carbide, or any suitable dielectric material.

Figure 1H:
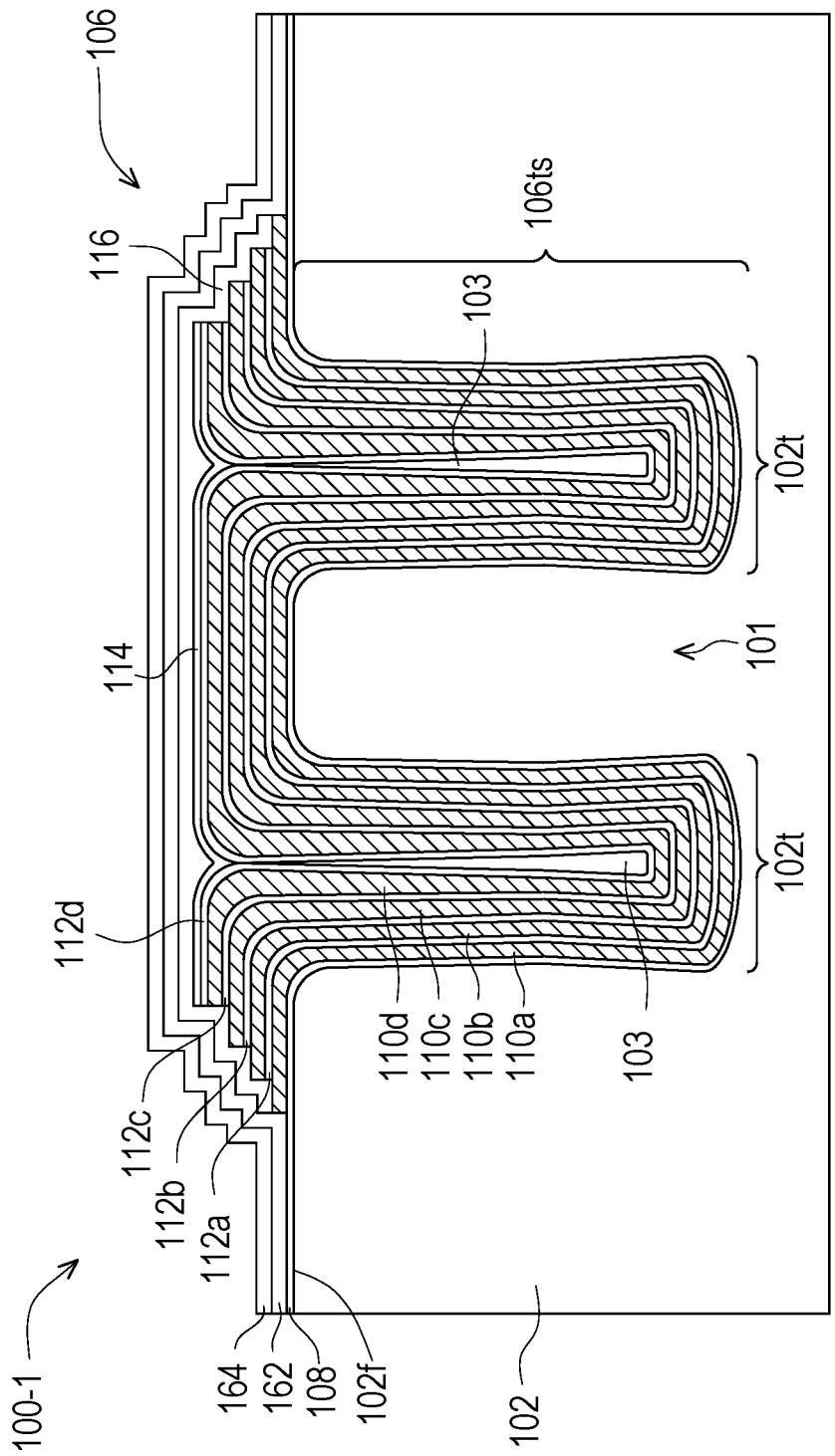
Figure 11:
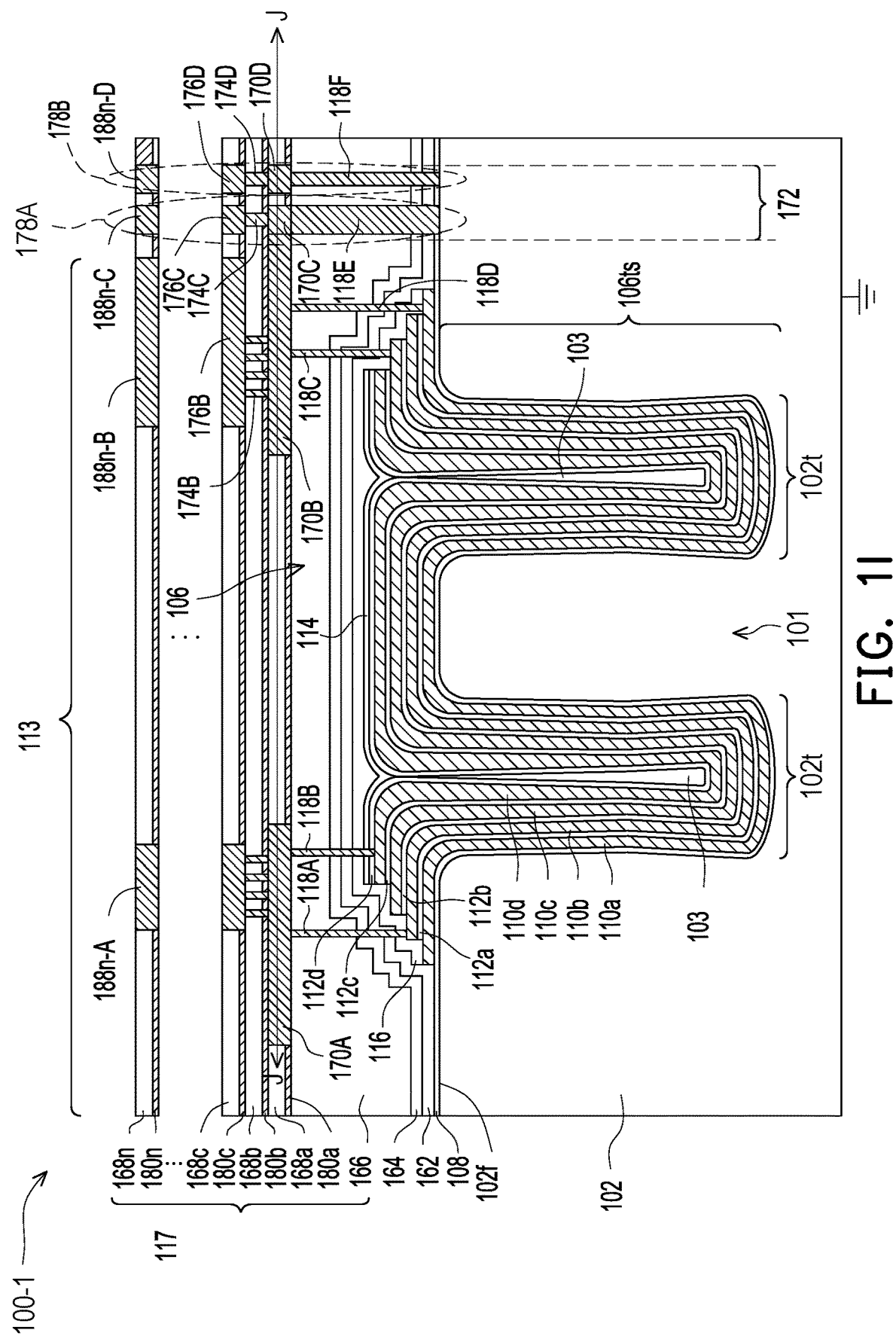

As shown in FIG. 1H, a first dielectric layer 162 is optionally formed over the semiconductor substrate 102 and a second dielectric layer 164 is optionally formed over the first dielectric layer 162. In some embodiments, the first dielectric layer 162 and/or the second dielectric layer 164 may be or include an oxide, such as silicon oxide, undoped silicon glass, any suitable dielectric material, or a combination thereof. The first and second dielectric layers 162, 164 may be deposited using ALD, CVD, thermal oxidation, or other suitable deposition techniques.

As shown in FIG. 1I, an interconnect structure 117 is formed over the semiconductor substrate 102 and the trench capacitor 106. In some embodiments, the interconnect structure 117 comprises a plurality of dielectric layers with conductive features embedded in the plurality of dielectric layers. Conductive features (e.g., conductive vias and conductive lines to be discussed below) may be formed using any suitable formation process (e.g., lithography with etching, damascene, dual damascene, or the like). In some embodiments, the steps for forming the conductive features may include forming openings in the respective dielectric layers, depositing a conductive layer in the openings, and subsequently performing a planarization process, such as a chemical mechanical planarization (CMP) process, to remove excess materials of the conductive material overfilling the openings. The conductive layer may be deposited by CVD, PVD, sputtering, electroplating, electroless plating, or other suitable deposition technique.

In the embodiment shown in FIG. 1I, the interconnect structure 117 comprises an interlayer dielectric (ILD) layer 166 with conductive vias 118A-118F embedded within the ILD layer 166, a first intermetal dielectric (IMD) layer 168a with conductive lines 170A-170D embedded within the first IMD layer 168a, a second IMD layer 168b with conductive vias 174A-174D embedded within the second IMD layer 168b, a third IMD layer 168c with conductive lines 176A-176D embedded within the third IMD layer 168c, and a plurality of etch stop layers 180a-c disposed between the ILD layer 166 and the first IMD layer 168a, the first and second IMD layers 168a, 168b, and the second and third IMD layers 168b, 168c, respectively. The IMD layers, the conductive features, and the etch stop layers may repeat until a desired number of the IMD layer 168n (e.g., topmost IMD layer in the interconnect structure 117), a desired number of the etch stop layer 180n, and a desired number of the conductive features 188n-A to 188n-D (e.g., topmost conductive features in the interconnect structure 117) embedded in the IMD layer 168n is achieved.

The ILD layer 166 and the IMD layers 168a-n may include or be formed of any suitable dielectric material, such as silicon oxide, a low dielectric constant (low-k) material, or a combination thereof. The low-k material may include fluorinated silica glass (FSG), phosphosilicate glass (PSG), borophosphosilicate glass (BPSG), amorphous fluorinated carbon, Parylene, BCB (bis-benzocyclobutenes), polyimide, $SiO_xC_yH_z$, or $SiO_xC_y$, where x, y and z are integers or non-integers, and/or other future developed low-k dielectric materials. The ILD layer 166 and the IMD layers 168a-n may be deposited by a plasma-enhanced CVD (PECVD) process or other suitable deposition technique. The material of the etch stop layers 180a-c is chosen such that etch rates of the etch stop layers 180a-n are less than etch rates of the first, second, and third IMD layers 168a-c. In some embodiments, the etch stop layers 180a-c may include the same material as the etch stop layer 116 described above. The conductive vias/lines 118A-118F, 170A-170D, 174A-174D, 176A-176D, and 188n-A to 188n-D may include or be formed of any suitable electrically conductive material and/or moisture barrier material, such as tungsten, copper, aluminum, titanium nitride, tantalum nitride, an alloy thereof, or a combination thereof.

In some embodiments, the conductive vias 118A-118D extend through the ILD layer 166, the second dielectric layer 164, the first dielectric layer 162, the etch stop layer 116 and in contact with an upper surface of each of the capacitor electrode layers 110a-d. The conductive vias 118E, 118F extend through the ILD layer 166, the second dielectric layer 164, the first dielectric layer 162, the etch stop layer 116 and in contact with the front side surface 102f of the semiconductor substrate 102. The conductive vias 118E, 118F are disposed at a seal region 172 which encircles an interior portion 113 of the semiconductor substrate 102. In some embodiments, the seal region 172 surrounds an outer perimeter of a circuit region where the active devices (e.g., transistors, diodes, capacitors, resistors, etc.) are located. The conductive vias 118E, 118F, the conducive lines 170C, 170D, the conductive vias 174C, 174D, the conductive lines 176C, 176D, and the conductive lines 188n-C, 188n-D near the edge of the semiconductor substrate 102 form inner and outer seal ring structures 178A, 178B, respectively. The seal ring structures 178A, 178B provide protection to active devices in the circuit region against undesired elements from the exterior environment, such as water vapor, during the subsequent processes. The conductive lines/vias of the seal ring structures 178A, 178B may be fabricated layer-by-layer in the same process with the conductive features (e.g., conductive vias 118A-D and 174A-B, conductive lines 170A-B, 176A-B, 188n-A to 188n-B) in the corresponding IMD layers 168a-n. In some embodiments, the seal ring structures 178A, 178B are in contact with the semiconductor substrate 102, which may be grounded or connected to a signal ground through internal connection (not shown).

The conductive vias 118A, 118B electrically connect the capacitor electrode layers 110b, 110d to the conductive line 170A. The conductive via 174A extend through the second etch stop layer 180b and the second IMD layer 168b, and electrically connect the conductive line 170A to the conductive line 176A. The conductive vias 118C, 118D electrically connect the capacitor electrode layers 110a, 110c to the conductive line 170B. The conductive via 174B extend through the second etch stop layer 180b and the second IMD layer 168b, and electrically connect the conductive line 170B to the conductive line 176B. In some embodiments, the conductive line 170A can represent the top electrode (e.g., capacitor electrode operating at a higher potential) of the trench capacitor 106, and the conductive line 170B can represent the bottom electrode (e.g., capacitor electrode operating at a lower potential) of the trench capacitor 106. Depending on the application, these orientations can be reversed.

In various embodiments, the one or more dielectric layers in the interconnect structure 117 are patterned so that the conductive line(s) embedded in the one or more dielectric layers are electrically connected to, and/or in physical contact with the seal ring structure (e.g., inner seal ring structure 178A). In some embodiments, one or more conductive lines disposed at the first IMD layer 168a (i.e., M1 level) is in physical contact with the inner seal ring structure. In some embodiments, one or more conductive lines at any IMD layer can be in physical contact with the inner seal ring structure. Having conductive line(s), particularly conductive lines coupled to capacitor electrode operating at a lower potential (e.g., capacitor electrode layers 110a, 110c), connected to and/or in physical contact with the inner seal ring structure 178A can help release electrostatic charges (or static electricity) from the trench capacitor 106 to the semiconductor substrate 102 which may be grounded or connected to a signal ground through internal connection (not shown). In some embodiments, the conductive line(s) representing the bottom electrode (e.g., capacitor electrode operating at a lower potential) of the trench capacitor 106 are electrically connected to, and/or in physical contact with the inner seal ring structure 178A. In some embodiments, the conductive line (e.g., conductive line 170C) at the M1 level (e.g., first IMD layer 168a) is disposed between and in contact with the conductive via (e.g., conductive via 118E) at the ILD layer 166 and the conductive via (e.g., conductive via 174C) at the M2 level (e.g., second IMD layer 168b). Alternatively, the conductive line (e.g., conductive line 170B) at the M1 level (e.g., first IMD layer 168a) may be extended to between and in contact with the conductive via (e.g., conductive via 118E) at the ILD layer 166 and the conductive via (e.g., conductive via 174C) at the M2 level (e.g., second IMD layer 168b). In either case, the electrostatic charges are released from the capacitor electrode layers to the seal ring structure, which is in physical contact with the semiconductor substrate 102 for discharge of electrostatic charges (or static electricity).

Figures 1, 1J:
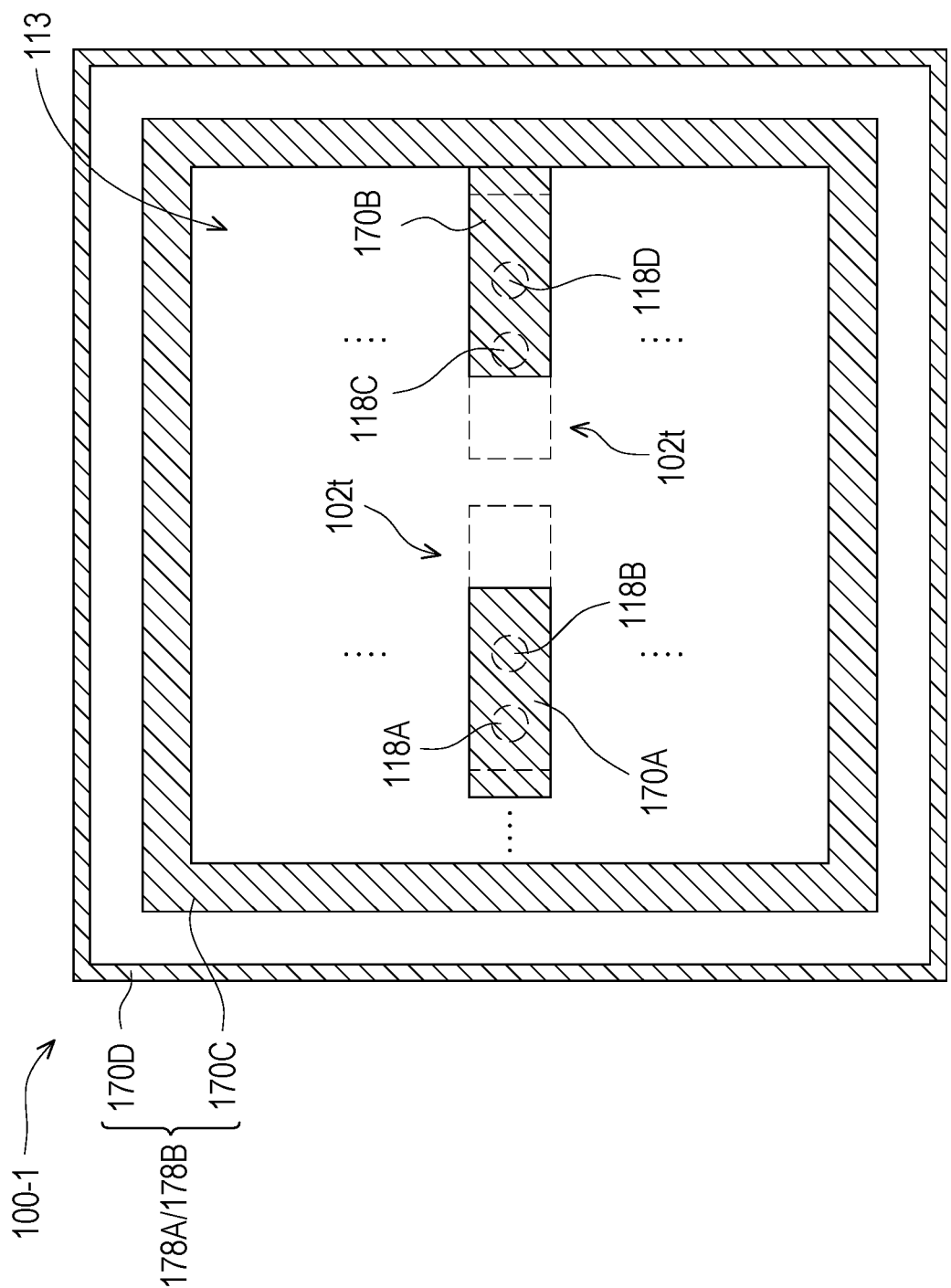
FIG. 1J-1 illustrates a schematic top view of a portion of the first semiconductor device structure taken along cross-section J-J of FIG. 1I, in accordance with some embodiments of the present disclosure.

FIG. 1J-1 illustrates a schematic top view of a portion of the first semiconductor device structure 100-1 taken along cross-section J-J of FIG. 1I, in accordance with some embodiments of the present disclosure. For the sake of brevity, only certain elements (e.g., trench 102t, conductive lines 170A-D, etc.) are shown. The trenches 102t (shown in dotted lines) are encircled by an inner seal ring structure 178A and an outer seal ring structure 178B surrounding the inner seal ring structure 178A. Each of the trenches 102t comprises capacitor electrode layers 110a-d and the capacitor dielectric layers 112a-d (not shown) as discussed above in FIG. 1I. In various embodiments, the capacitor electrodes operating at a lower potential (e.g., capacitor electrode layers 110a, 110c, FIG. 1I) of at least one trench 102t are electrically connected to the conductive line 170B through conductive vias 118C, 118D. The conductive line 170B is electrically connected to and in physical contact with the conductive line 170C that forms the inner seal ring structure 178A to help release electrostatic charges from the trench capacitor 106. On the other hand, the capacitor electrodes operating at a higher potential (e.g., capacitor electrode layers 110b, 110d) of the trench(es) 102t are electrically connected (through conductive vias 118A, 118B, for example) to the conductive line 170A, which is floating and electrically isolated from the inner and outer seal ring structures 178A, 178B. While not shown, a plurality of trenches 102t may be arranged in a two-dimensional (2D) trench array, which may include a plurality of rows of trenches and a plurality of columns of trenches 102t.

Figures 1, 1J, 2:
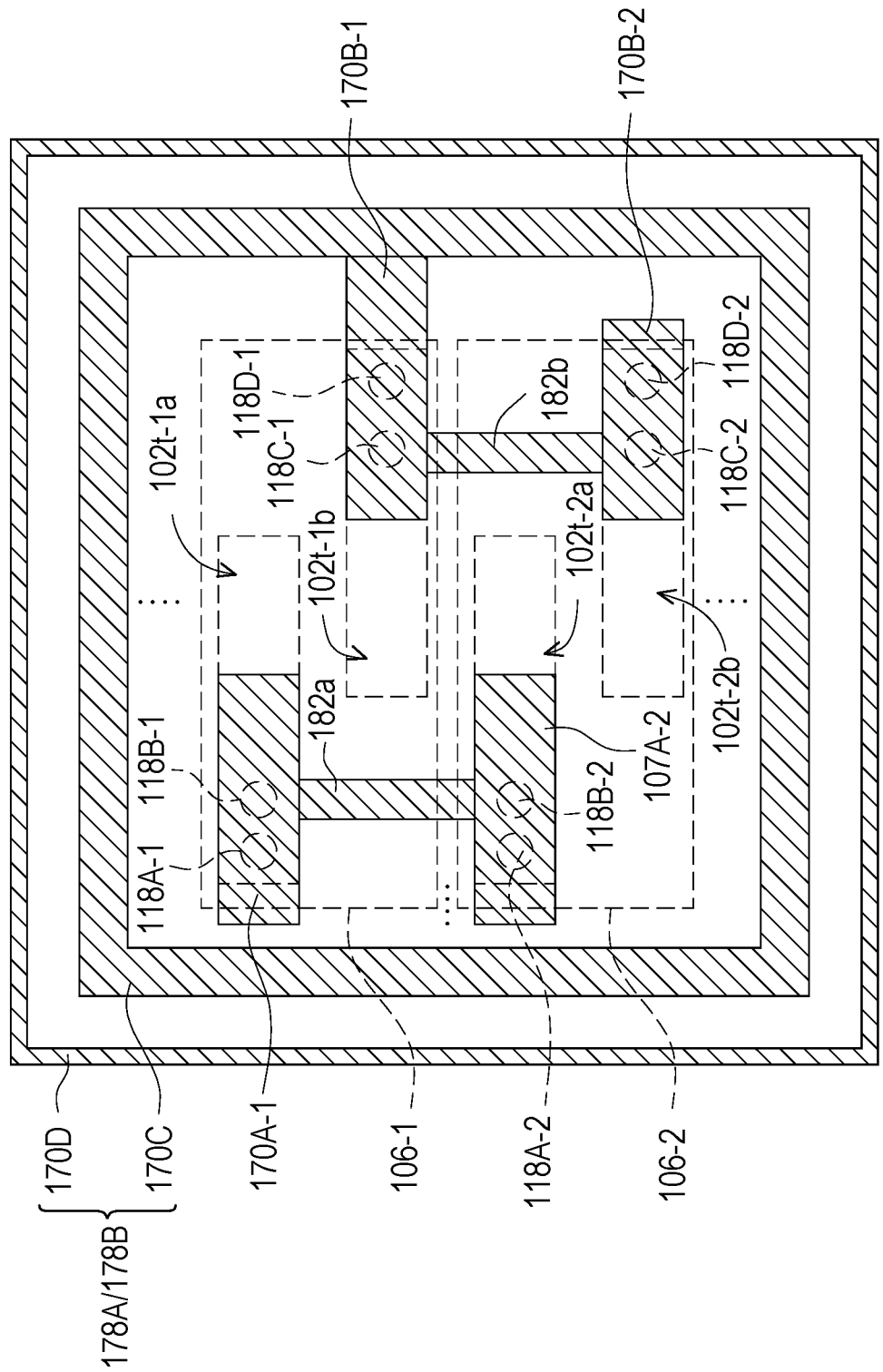

FIG. 1J-2 illustrates a schematic top view of a portion of a semiconductor device structure having multiple trench capacitors, in accordance with some alternative embodiments. For the ease of illustration and discussion, only two trench capacitors 106-1, 106-2 are shown. Each trench capacitors 106-1, 106-2 may include a plurality of trenches 102t, and each of the trenches 102t comprises capacitor electrode layers 110a-d and the capacitor dielectric layers 112a-d (not shown) as discussed above in FIG. 1I. In the embodiment shown in FIG. 1J-2, each of the trench capacitors 106-1, 106-2 includes two trenches (shown in dotted lines) 102t-1a, 102t-1b and 102t-2a, 102t-2b, respectively, and the trenches 102t-1a, 102t-1b and 102t-2a, 102t-2b are arranged in a staggered configuration. The trench capacitors 106-1, 106-2 are electrically coupled such that the conductive line 170A-1 (e.g., capacitor electrode operating at a higher potential) of the trench capacitor 106-1 and the conductive line 170A-2 (e.g., capacitor electrode operating at a higher potential) of the trench capacitor 106-2 are coupled together by line 182a, and the conductive line 170B-1 (e.g., capacitor electrode at a lower potential) of the trench capacitor 106-1 and the conductive line 170B-2 (e.g., capacitor electrode at a lower potential) of the trench capacitor 106-2 are coupled together by line 182b. With this configuration, the trench capacitors 106-1 and 106-2 are coupled in parallel and can provide a larger effective capacitance.

In one embodiment, the capacitor electrodes operating at higher potential of the trench capacitor 106-2 (e.g., capacitor electrode layers 110b, 110d, FIG. 1I) are electrically connected to the conductive line 170A-2 through conductive vias 118A-2, 118B-2, and the capacitor electrodes operating at a lower potential (e.g., capacitor electrode layers 110a, 110c, FIG. 1I) of the trench capacitor 106-2 are electrically connected to the conductive line 170B-2 through conductive vias 118C-2, 118D-2. The capacitor electrodes operating at higher potential of the trench capacitor 106-1 (e.g., capacitor electrode layers 110b, 110d, FIG. 1I) are electrically connected to the conductive line 170A-1 through conductive vias 118A-1, 118B-1, and the capacitor electrodes operating at a lower potential (e.g., capacitor electrode layers 110a, 110c, FIG. 1I) of the trench capacitor 106-1 are electrically connected to the conductive line 170B-1 through conductive vias 118C-1, 118D-1. Likewise, the conductive line 170B-1 is electrically connected to and in physical contact with the conductive line 170C that forms the inner seal ring structure 178A to help release electrostatic charges from the trench capacitors 106-1, 106-2. On the other hand, the capacitor electrodes operating at a higher potential of the trench capacitors 106-1, 106-2 are floating and electrically isolated from the inner and outer seal ring structures 178A, 178B.

FIG. 1J-3 illustrates a schematic top view of a portion of a semiconductor device structure having multiple trench capacitors, in accordance with some alternative embodiments. The embodiment of FIG. 1J-3 is substantially identical to the embodiment shown in FIG. 1J-2 except that both conductive lines 170B-1, 170B-2 (electrically connecting to capacitor electrodes operating at a lower potential) of the trench capacitor 106-1, 106-2 are electrically connected to and in physical contact with the conductive line 170C that forms the inner seal ring structure 178A to help release electrostatic charges from the trench capacitor 106-1, 106-2.

FIG. 1J-4 illustrates a schematic top view of a portion of a semiconductor device structure having multiple trench capacitors, in accordance with some alternative embodiments. The embodiment of FIG. 1J-4 is substantially identical to the embodiment shown in FIG. 1J-3 except that the conductive lines 170B-1, 170B-2 (electrically connecting to capacitor electrodes operating at a lower potential) of the trench capacitor 106-1, 106-2 are replaced with a single conductive pad 186. The conductive pad 186 may include the same material as the conductive lines 170B. The conductive pad 186 may be disposed at any IMD layer of the interconnect structure for the trench capacitors 106-1, 106-2. In some embodiments, the conductive pad 186 is disposed at the first IMD layer 168a (FIG. 1I). The conductive pad 186 is electrically connected (through conductive vias 118C-1, 118D-1, 118C-2, 118D-2) to the capacitor electrode layers of the trenches 102t-1b and 102t-2b operating at a lower potential. Likewise, the conductive pad 186 is electrically connected to and in physical contact with the conductive line 170C that forms the inner seal ring structure 178A to help release electrostatic charges from the trench capacitor 106-1, 106-2.

Various embodiments discussed above provide a semiconductor device structure having a trench capacitor with a high capacitance density and low substrate warpage due to the air gap formed within each trench segments and enclosed by a plurality of capacitor electrode layers and capacitor dielectric layers. In some embodiments, the capacitance density of the trench capacitor can be further increased by multi-wafer stacking. For example, two or more semiconductor device structures having the inventive trench capacitor may be stacked up and electrically connected to each other by through-hole structures. FIGS. 1K-1O illustrate cross-sectional views of various processing steps of manufacturing a multi-wafer structure with a high capacitance density and low substrate warpage, in accordance with some embodiments of this disclosure.

Figures 1, 1J, 2, 3:
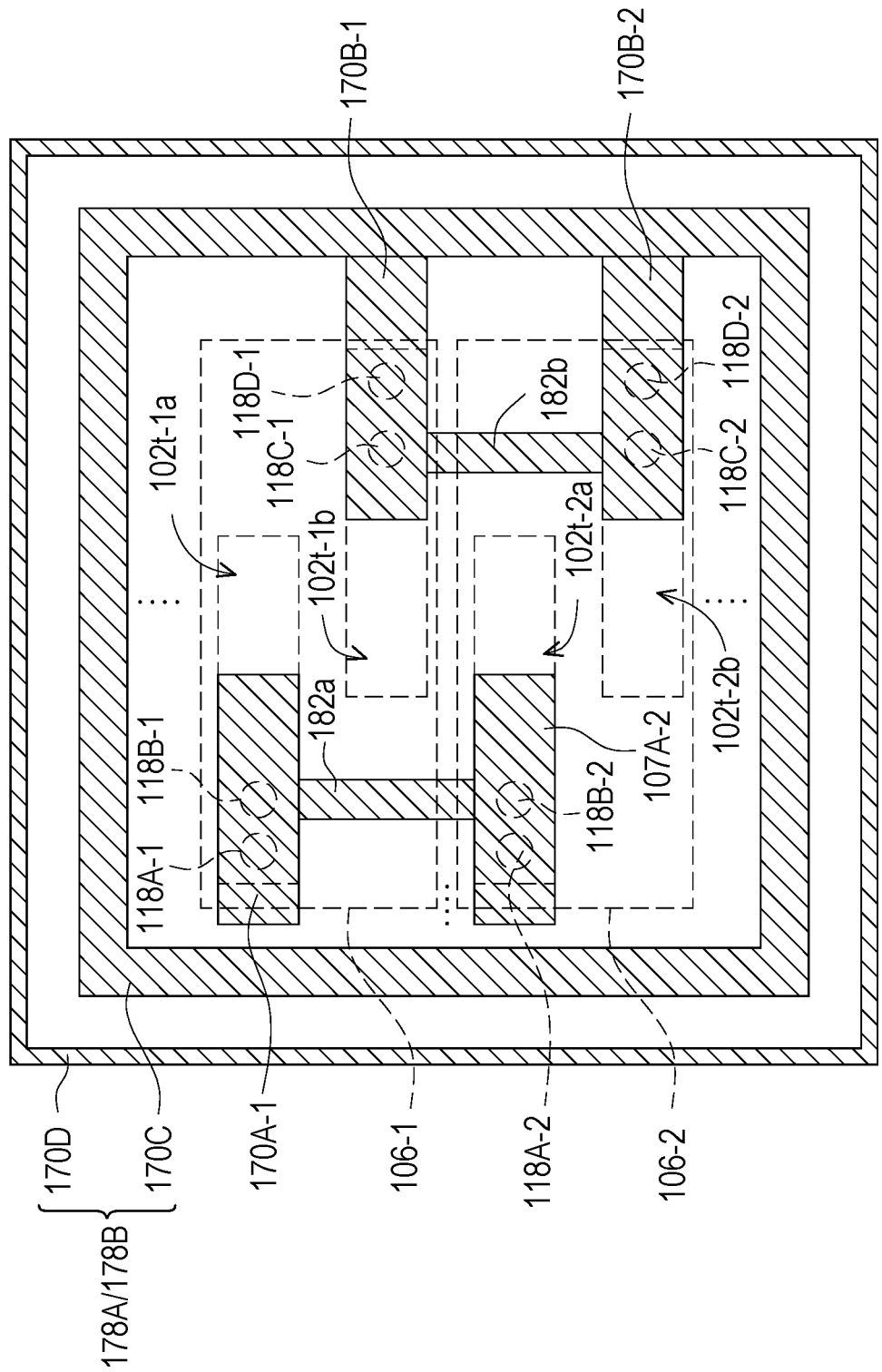
Figures 1, 1J, 2, 3, 4:
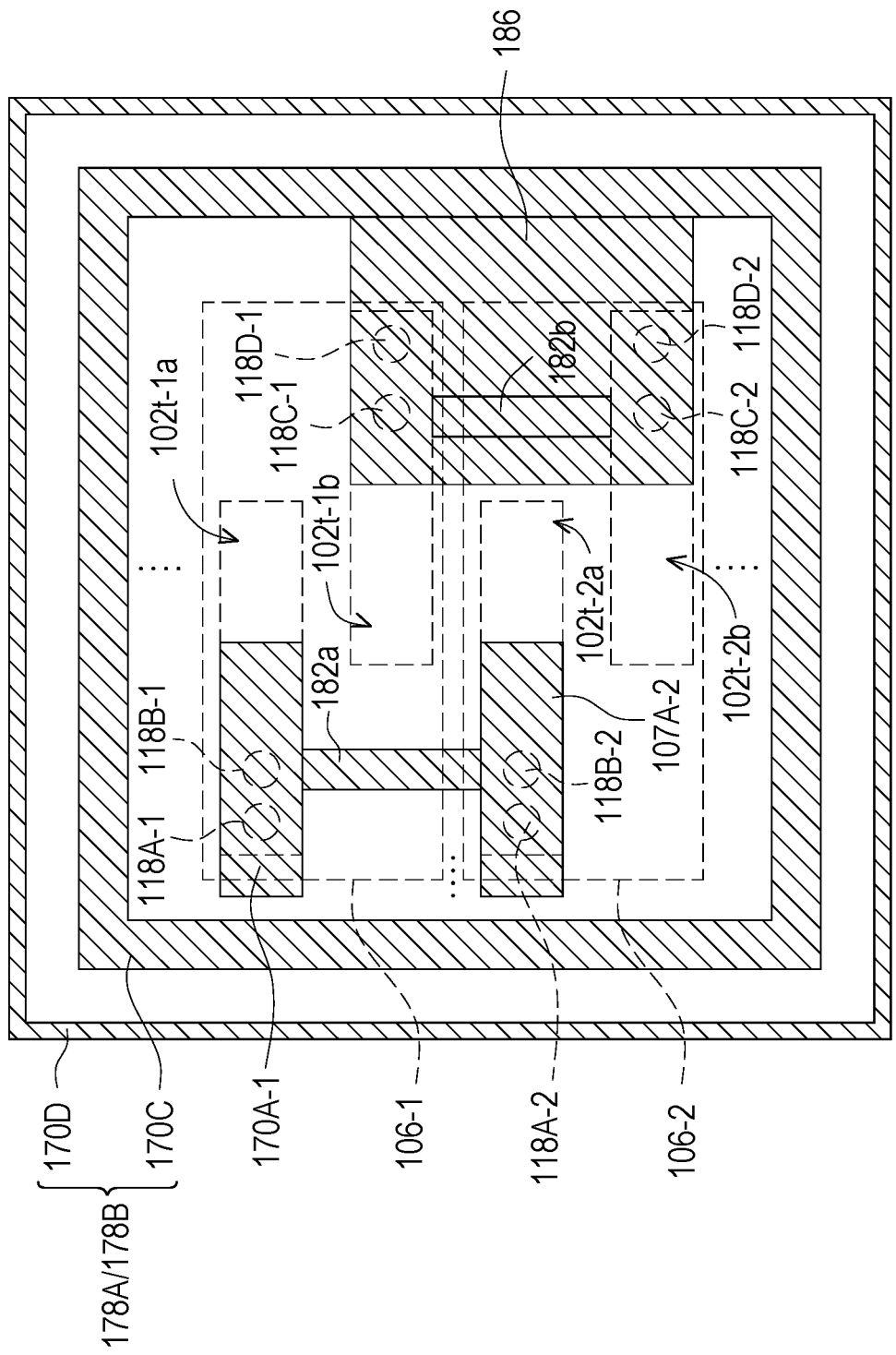
Figure 1K:
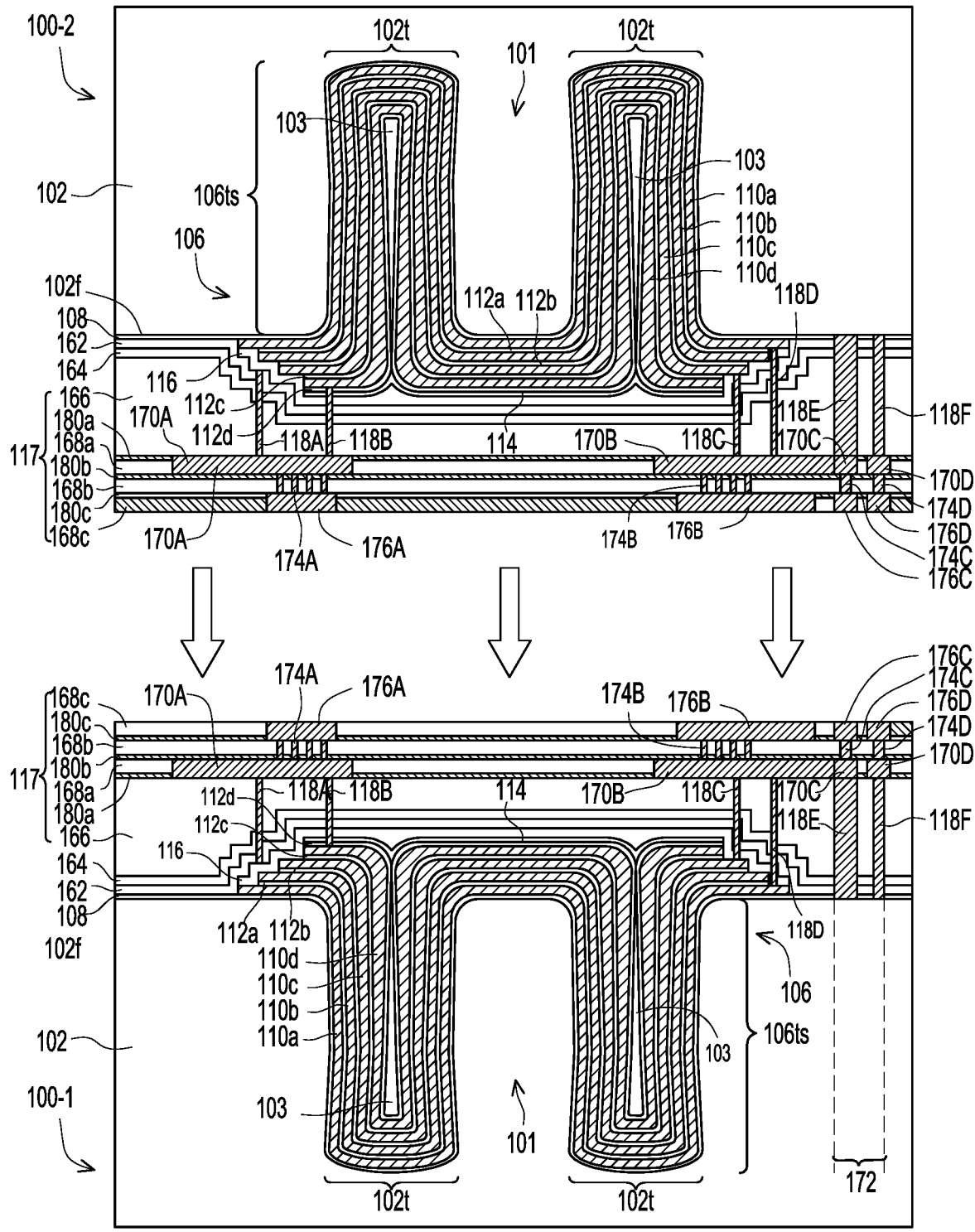

FIG. 1K shows a manufacturing stage of the first semiconductor device structure 100-1 and a second semiconductor device structure 100-2 prior to a bonding process, in accordance with some embodiments. In one embodiment, the second semiconductor device structure 100-2 has similar features as the first semiconductor device structure 100-1, and for the purpose of the following discussion, the features of the second semiconductor device structure 100-2 will use the reference numerals similar or identical to features of the first semiconductor device structure 100-1. The second semiconductor device structure 100-2 has features substantially identical to the features of the first semiconductor device structure 100-1 except that the conductive features of the interconnect structure 117 of the first and second semiconductor device structures 100-1, 100-2 are configured such that the capacitor electrodes operating at a lower potential (e.g., capacitor electrode layers 110a, 110c) of the trench capacitor 106 of the second semiconductor device structure 100-2 are electrically connected to the capacitor electrodes operating at a lower potential (e.g., capacitor electrode layers 110a, 110c) of the trench capacitor 106 of the first semiconductor device structure 100-1, while the capacitor electrodes operating at a higher potential (e.g., capacitor electrode layers 110b, 110d) of the trench capacitor 106 of the second semiconductor device structure 100-2 are electrically connected to the capacitor electrodes operating at a higher potential (e.g., capacitor electrode layers 110b, 110d) of the trench capacitor 106 of the first semiconductor device structure 100-1. The first semiconductor device structure 100-1 and the second semiconductor device structure 100-2 are arranged with the front sides of the first semiconductor device structure 100-1 and the second semiconductor device structure 100-2 facing each other prior to the bonding process, as shown in FIG. 1K.

Figure 1L:
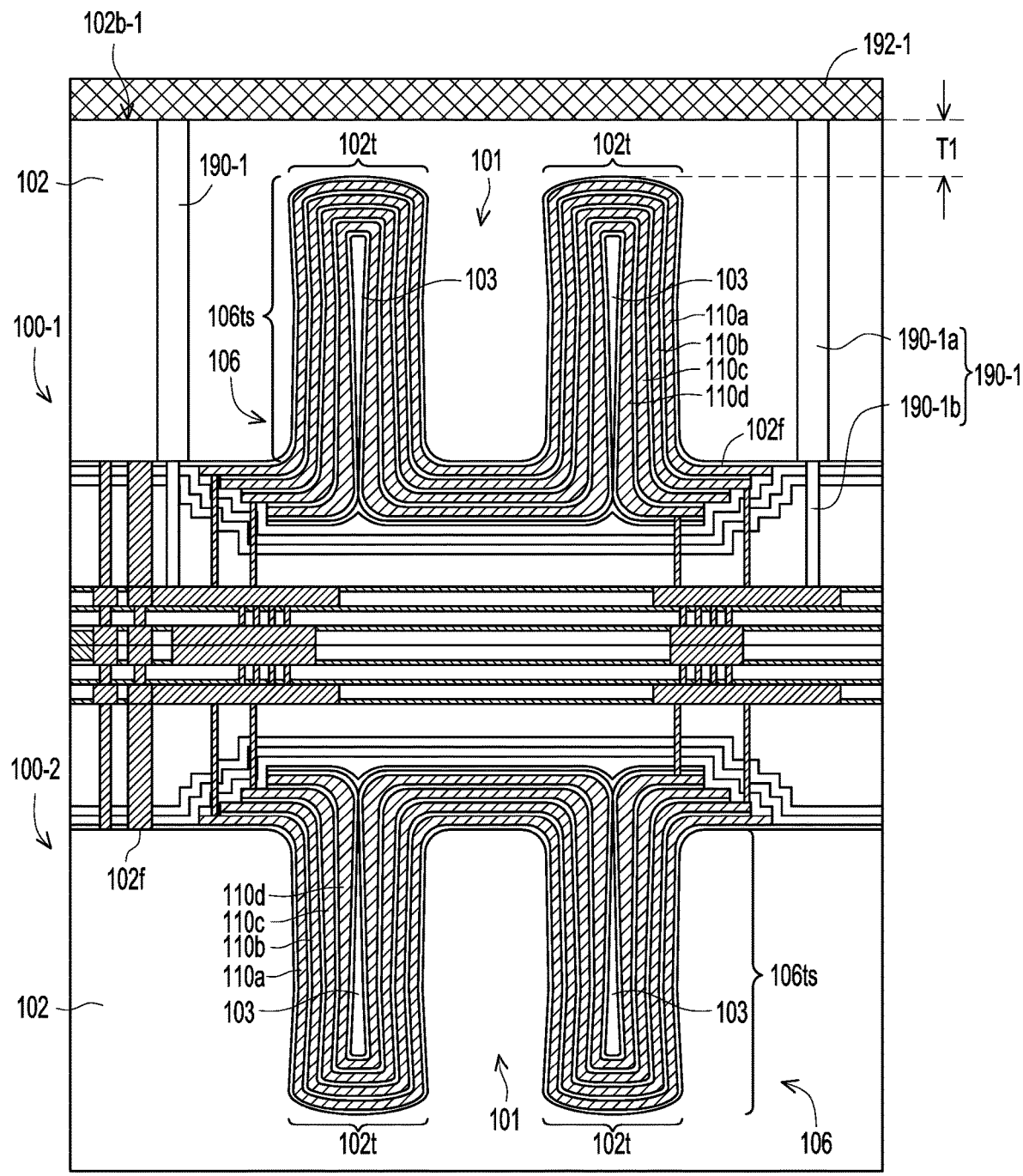

As shown in FIG. 1L, the first semiconductor device structure 100-1 and the second semiconductor device structure 100-2 are bonded, in accordance with some embodiments. In some embodiments, the first semiconductor device structure 100-1 and the second semiconductor device structure 100-2 are bonded using a direct bonding process, such as a hybrid boding process (e.g., dielectric-to-dielectric and metal-to-metal bonding). The direct bonding process is performed so that the conductive lines 176A, 176B, 176C, 176D of the second semiconductor device structure 100-2 is in direct contact with the conductive lines 176A, 176B, 176C, 176D of the first semiconductor device structure 100-1, while the third IMD layer 168c of the second semiconductor device structure 100-2 is in direct contact with the third IMD layer 168c of the first semiconductor device structure 100-1. It is contemplated that the first semiconductor device structure 100-1 and the second semiconductor device structure 100-2 may be bonded using other suitable bonding process, such as metal-to-metal bonding (e.g., copper-to-copper bonding), metal-to-dielectric bonding (e.g., oxide-to-copper bonding), dielectric-to-dielectric bonding (e.g., oxide-to-oxide bonding), and/or the like. In such cases, the first semiconductor device structure 100-1 and the second semiconductor device structure 100-2 may each have a bonding layer (with corresponding metal/dielectric features) disposed at the front side of the first semiconductor device structure 100-1 and the second semiconductor device structure 100-2 for bonding.

After the first semiconductor device structure 100-1 and the second semiconductor device structure 100-2 are bonded, the structure of the first and second semiconductor device structures 100-1, 100-2 is flipped over so that the backside 102b-1 of the first semiconductor device structure 100-1 is facing up. A thinning process may be applied to the backside 102b-1 of the first semiconductor device structure 100-1 to remove a substantial amount of substrate material from the backside 102b-1 of the semiconductor substrate 102 of the first semiconductor device structure 100-1. The thinning process may be implemented by using any suitable techniques such as grinding, polishing, and/or chemical etching. If desired, a chemical thinning process may apply an etching chemical to further thin the backside 102b-1 of the semiconductor substrate 102 of the first semiconductor device structure 100-1. The thickness T1 of the semiconductor substrate 102 of the first semiconductor device structure 100-1 after thinning process should be about 0.8 µm or above, for example about 2 µm to about 10 µm, to prevent wrapping or breaking of the semiconductor substrate 102. If the thickness T1 is greater than about 10 µm, the overall length of the subsequently formed through-hole structures is extended, which leads to increase of electrical resistivity and resistive-capacitive (RC) delay.

After the thinning process, first through-hole structures 190-1 are formed on the backside 102b-1 of the semiconductor substrate 102 of the first semiconductor device structure 100-1. The first through-hole structures 190-1 extend through the semiconductor substrate 102, the etch stop layer 116, the optional second dielectric layer 164, the optional first dielectric layer 162, the ILD layer 166, and in contact with a portion of selected conductive features, such as the conductive line 170A, 170B disposed at the first IMD layer 168a of the interconnect structure 117 of the first semiconductor device structure 100-1. In some embodiments, the first through-hole structures 190-1 may each include two portions, in which a first portion 190-1a of the first through-hole structure 190-1 extends from the backside 102b-1 to the front side 102f of the semiconductor substrate 102, and a second portion 190-1b of the first through-hole structure 190-1 extend through the etch stop layer 116, the optional first and second dielectric layer 162, 164, the ILD layer 166, and in contact with a portion of the conductive line 170A, 170B disposed at the first IMD layer 168a of the interconnect structure 117 of the first semiconductor device structure 100-1. In such cases, the first portion 190-1a of the first through-hole structures 190-1 may have a width W1 and the second portion 190-1b of the first through-hole structures 190-1 may have a width W2 that is less than the width W1. The first through-hole structures 190-1 electrically connects various conductive features of the interconnect structure 117 of the first semiconductor device structure 100-1 to a subsequently formed redistribution layer (e.g., a first redistribution layer 192-1).

The first through-hole structures 190-1 may be formed by forming openings, using a photolithography process and one or more etch processes, in the semiconductor substrate 102, the etch stop layer 116, the optional second dielectric layer 164, the optional first dielectric layer 162, and the ILD layer 166 to expose a portion of the conductive lines 170A, 170B. A suitable deposition process, such as an electro-chemical plating process, is then used to fill the openings with a conducive material, which may be copper, tungsten, titanium, aluminum, or the like. The first through-hole structures 190-1 may be through-silicon-via (TSV), through-oxide-via (TOV), through-insulator-via (TIV), or big through-silicon-via (BTSV). In one embodiment, the first through-hole structures 190-1 are BTSV. The excess conductive materials may be removed by a planarization process (e.g., a CMP process), or the like, using the semiconductor substrate 102 as a stop layer. While not shown, one or more barrier layers (e.g., TaN or the like) may be formed along the sidewalls of the openings to prevent the subsequent conductive material from diffusing into the neighboring layers.

After the first through-hole structures 190-1 are formed, a first redistribution layer (RDL) 192-1 is formed over the backside 102b-1 of the semiconductor substrate 102 of the first semiconductor device structure 100-1, in accordance with some embodiments. The first RDL 192-1 may include one or more dielectric layers (not shown) with conductive elements (not shown) disposed within the one or more dielectric layers. The conductive elements may be conductive lines/traces and are electrically coupled to the first through-hole structures 190-1. As will be discussed in greater detail below, the first RDL 192-1 and a subsequently formed third RDL 192-3 of a third semiconductor device structure 100-3 (FIG. 1N) are to be bonded together through an insulator-to-insulator and a metal-to-metal hybrid bonding technology, allowing power and electrical signals from the third semiconductor device structure 100-3 to be distributed to various elements in the first and second semiconductor device structures 100-1, 100-2.

Figure 1M:
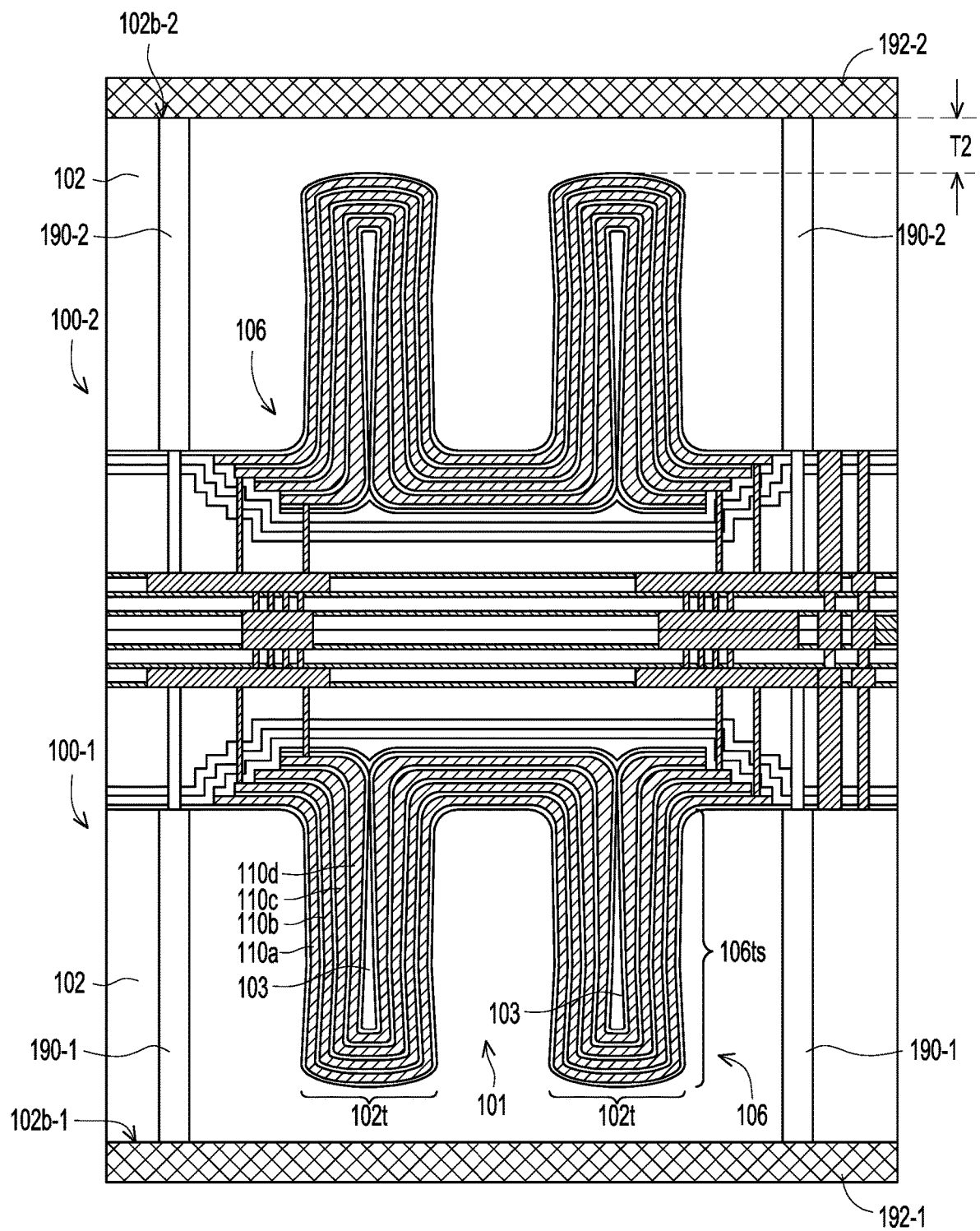

As shown in FIG. 1M, after the first through-hole 190-1 and the first RDL 192-1 are formed over the backside 102b-1 of the semiconductor substrate 102 of the first semiconductor device structure 100-1, the structure of the first and second semiconductor device structures 100-1, 100-2 is flipped again so that the backside 102b-2 of the second semiconductor device structure 100-2 is facing up. A thinning process (and a chemical thinning process) may be applied to the backside 102b-2 of the second semiconductor device structure 100-2 so that the thickness T2 of the semiconductor substrate 102 of the second semiconductor device structure 100-2 after thinning process is about 0.8 µm or above, for example about 2 µm to about 10 µm. Next, second through-hole structures 190-2 are formed in the second semiconductor device structure 100-2 in a similar fashion as the first through-hole structures 190-1. In one embodiment, the second through-hole structures 190-2 extend through the semiconductor substrate 102, the etch stop layer 116, the optional second dielectric layer 164, the optional first dielectric layer 162, the ILD layer 166, and in contact with a portion of selected conductive features, such as the conductive line 170A, 170B disposed at the first IMD layer 168a of the interconnect structure 117 of the second semiconductor device structure 100-2. Once the second through-hole structures 190-2 are formed, a second RDL 192-2 is formed on the backside 102b-2 of the semiconductor substrate 102 of the second semiconductor device structure 100-2. Likewise, the second RDL 192-2 may include one or more dielectric layers (not shown) with conductive elements (not shown) disposed within the one or more dielectric layers. The conductive elements may be conductive lines/traces and are electrically coupled to the second through-hole structures 190-2.

Figure 1N:
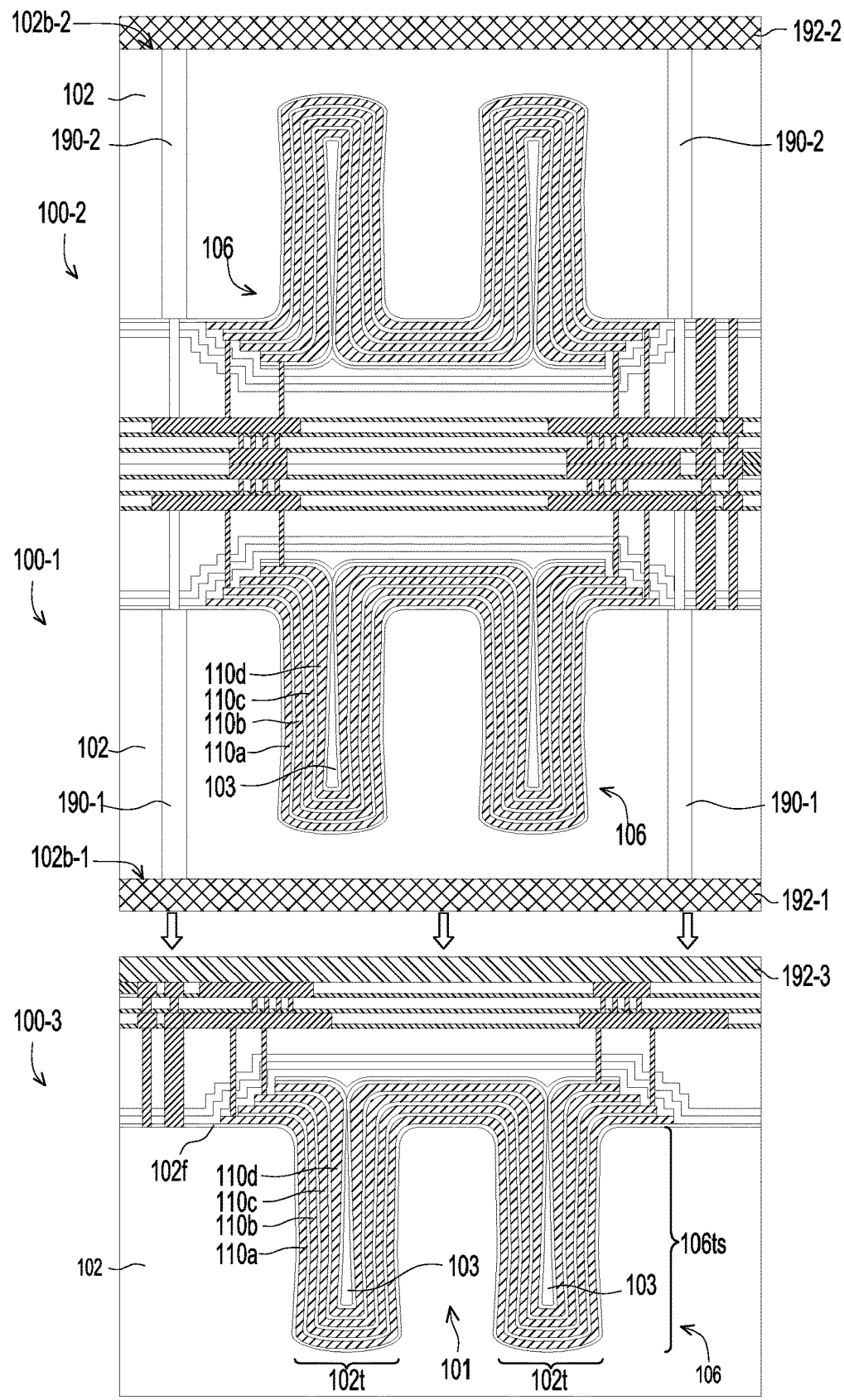
Figure 10:
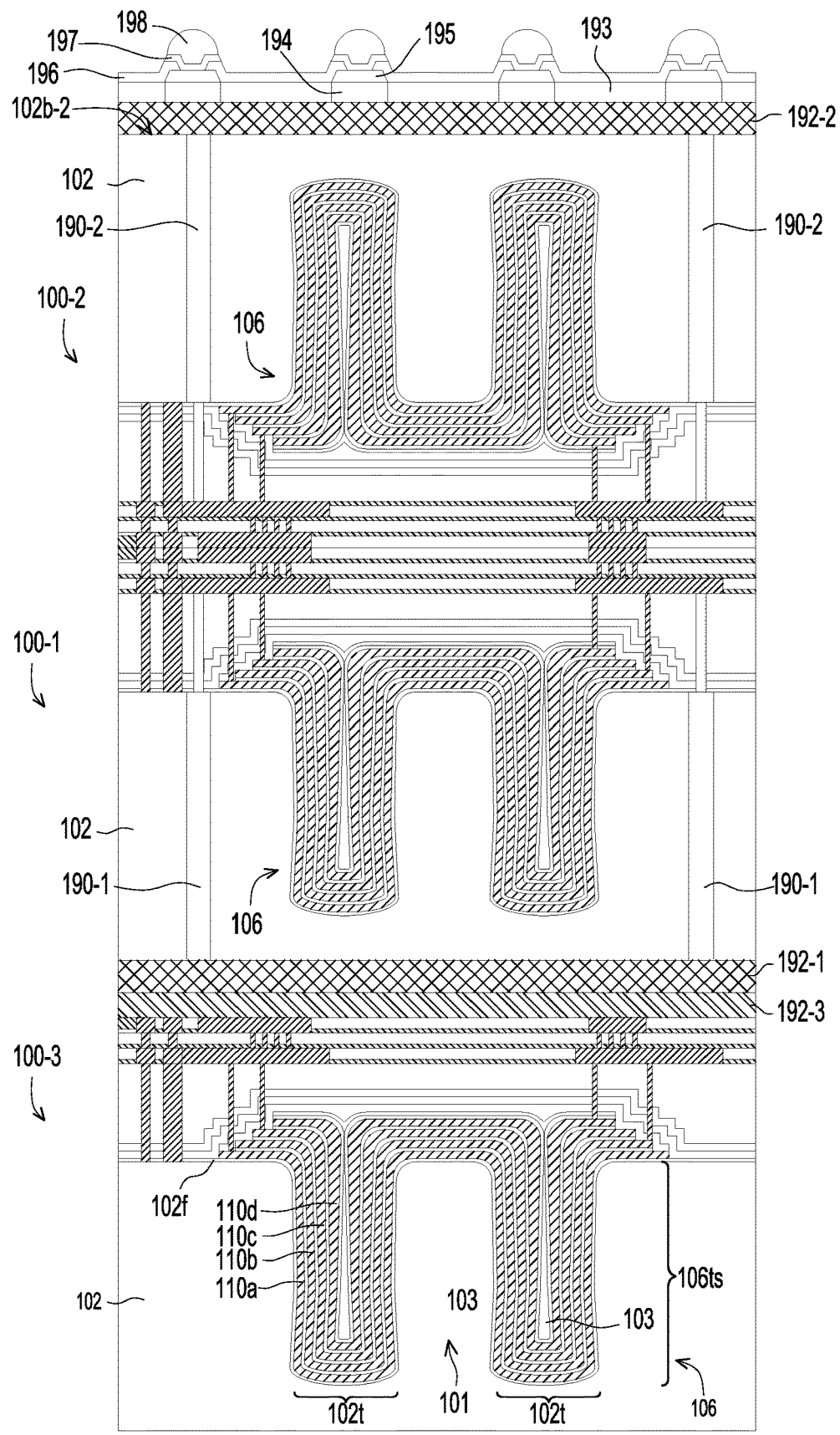
Figure 2:
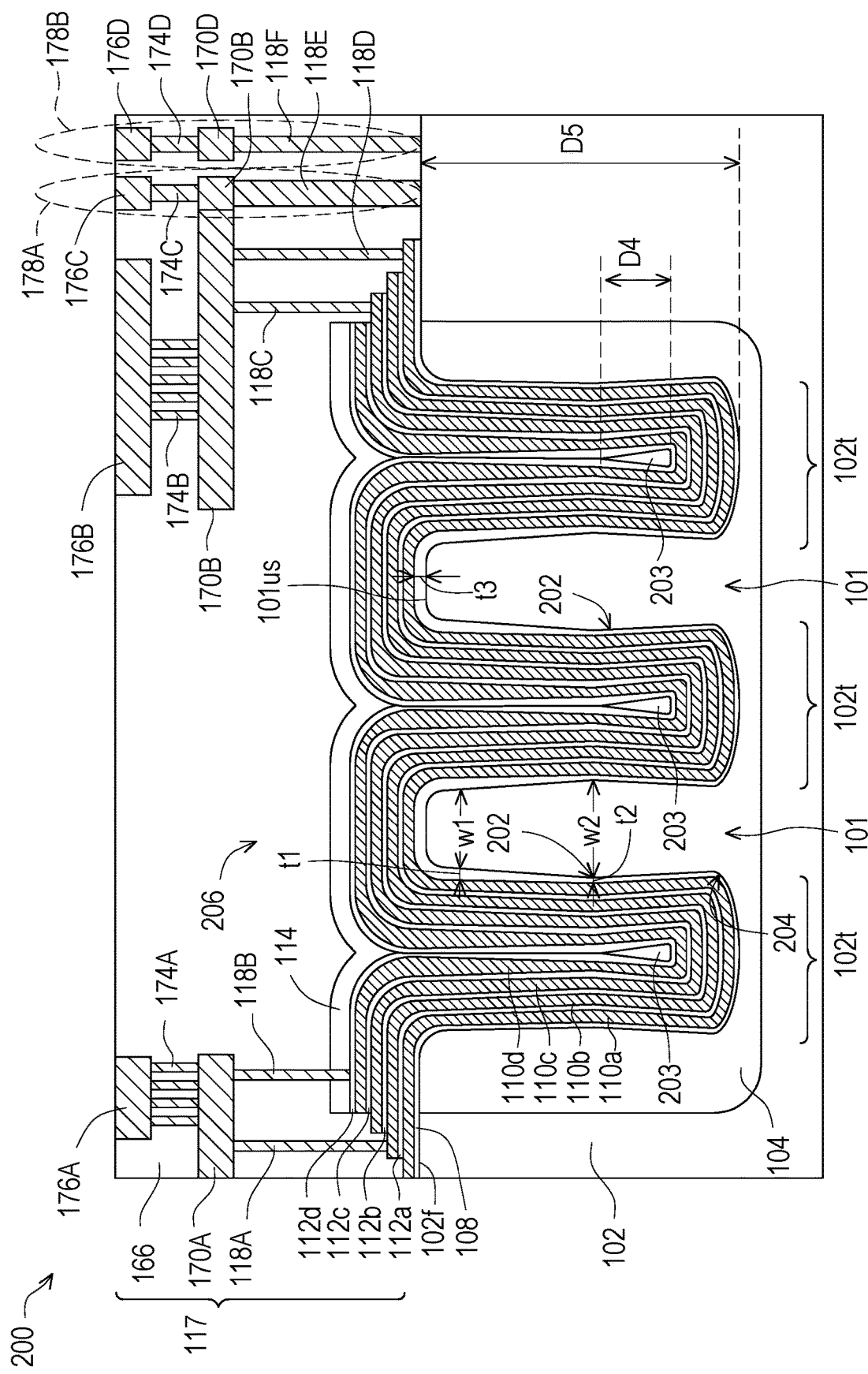
Figure 3:
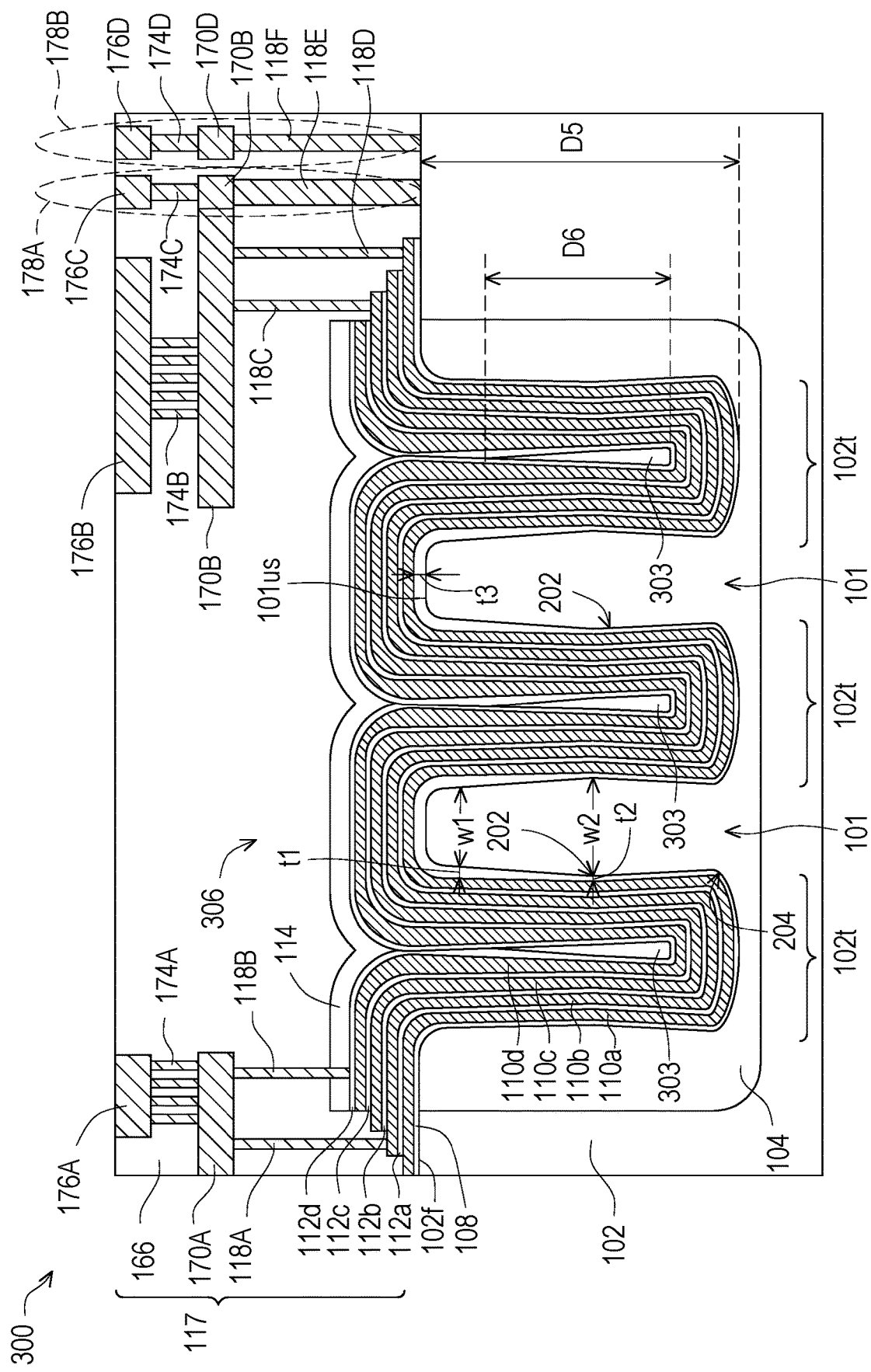
Figure 4:
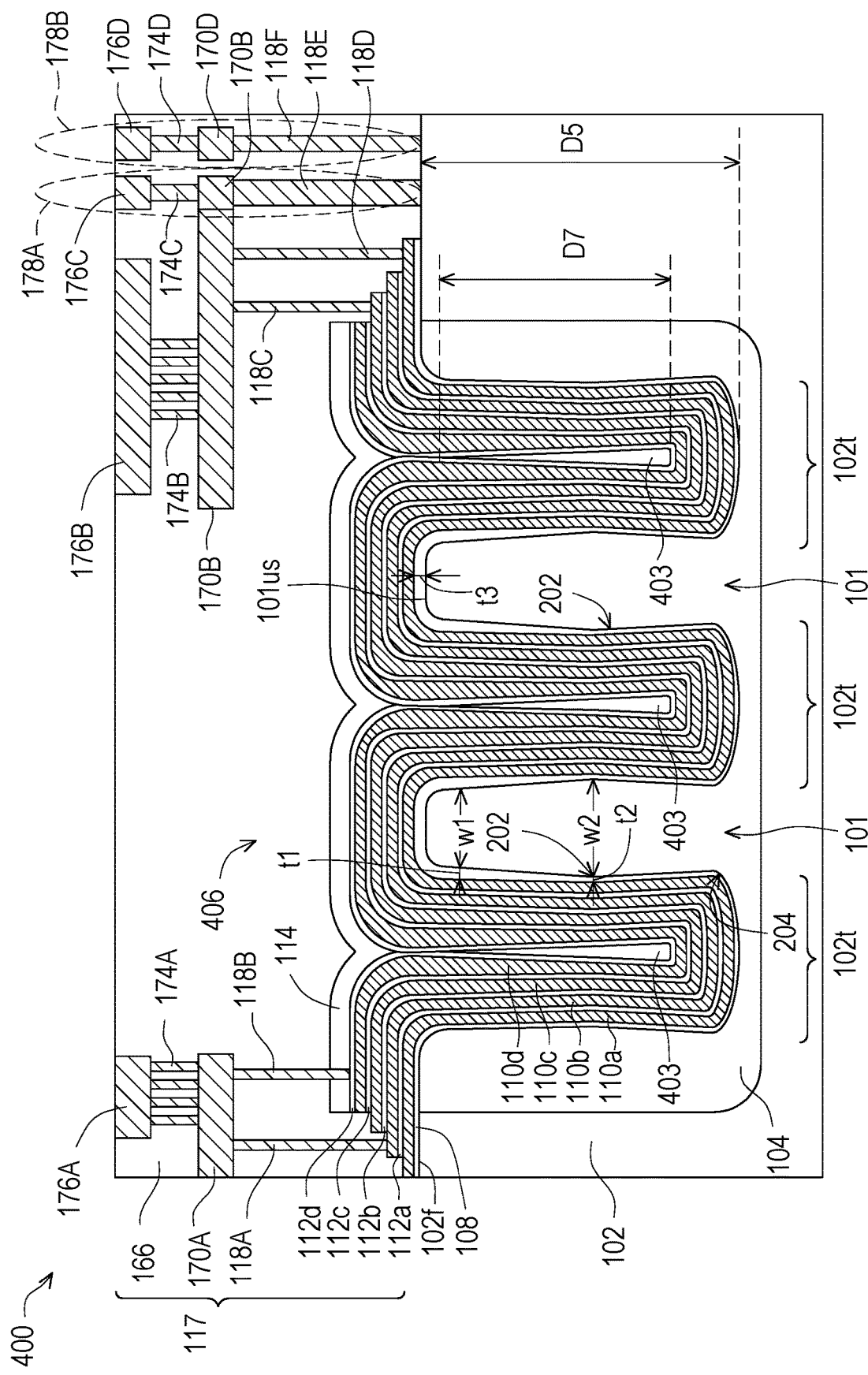

FIG. 1N shows a manufacturing stage of the structure of the first semiconductor device structure 100-1 and the second semiconductor device structure 100-2 prior to bonding with a third semiconductor device structure 100-3, in accordance with some embodiments. The third semiconductor device structure 100-3 is substantially similar to the first semiconductor device structure 100-1 shown in FIG. 1I except that a third RDL 192-3 is further formed on a front side of the third semiconductor device structure 100-3. Likewise, the third RDL 192-3 may include one or more dielectric layers (not shown) with conductive elements (not shown) disposed within the one or more dielectric layers. The conductive elements may be conductive lines/traces and are electrically coupled to various conductive features embedded within the interconnect structure 170 of the third semiconductor device structure 100-3. As shown in FIG. 1N, the third semiconductor device structure 100-3 and the structure of the first semiconductor device structure 100-1 and the second semiconductor device structure 100-2 are arranged so that a front side of the third RDL 192-3 of the third semiconductor device structure 100-3 is facing the front side of the first RDL 192-1 of the first semiconductor device structure 100-1. For the purpose of the following discussion, the features of the third semiconductor device structure 100-3 will use the reference numerals similar or identical to features of the first semiconductor device structure 100-1. It is understood that while the third semiconductor device structure 100-3 is shown to be bonded to the first semiconductor device structure 100-1, the third semiconductor device structure 100-3 may also be bonded to the backside 102b-2 of the second semiconductor device structure 100-2.

As shown in FIG. 1O, the third semiconductor device structure 100-3 is bonded to the first semiconductor device structure 100-1 using a hybrid bonding technology, e.g., by bonding the third RDL 192-3 of the third semiconductor device structure 100-3 to the first RDL 192-1 of the first semiconductor device structure 100-1. While increasing the capacitance density through the multi-wafer stacking, the first, second, and third through-hole structures 190-1, 190-2, the first, second, and third RDL 192-1, 192-2, 192-3, and conductive features of the interconnect structures 117 of the first, second, and third semiconductor device structures 100-1, 100-2, 100-3 also ensure an electric current/power is effectively distributed to various elements/devices between the first, second, and third semiconductor device structures 100-1, 100-2, 100-3. While three semiconductor device structures are shown and discussed, it is contemplated that four or more semiconductor device structures may be bonded by repeating the bonding process of the first, second, and third semiconductor device structures 100-1, 100-2, 100-3 discussed in this disclosure to achieve the desired capacitance density.

FIG. 1O further illustrates a dielectric layer 193 is formed over the second RDL 192-2 and has conductive lines 194 embedded therein. The conductive lines 194 may be electrically coupled to the underlying conductive features of the second RDL 192-2 to achieve the desired electrical configuration. The dielectric layer 193 and the conductive lines 194 may be similar to the IMD layer (e.g., first IMD layer 168a) and the conductive features (e.g., conductive line 170A) described above. Contact pads 195 are formed over and in electrical contact with one or more respective conductive lines 194. The contact pads 195 may include the same conductive material as the conductive features disposed in the interconnect structure 117, and may be formed over the dielectric layer 193 by first depositing a conductive material using PVD, ALD, electro-chemical plating, electroless plating, or the like, or a combination thereof. Subsequently, the conductive material is patterned to form the contact pads 195 using photolithography and one or more etching processes. A passivation layer 196 is formed over the dielectric layer 193 and over the contact pads 195. In some embodiments, the passivation layer 196 may include one or more layers of insulating materials such as silicon nitride, silicon oxide, phosphosilicate glass (PSG), borophosphosilicate glass (BPSG), BCB (bis-benzocyclobutenes), polyimide, or the like, or a combination thereof, and may be formed using a spin-on coating process or other suitable deposition process. The passivation layer 196 is then patterned using suitable photolithography and etching processes to form openings exposing portions of the contact pads 195. Next, underbump metallization (UBMs) 197 is formed over the contact pads 195. The UBMs 197 may be formed by depositing a mask layer over the passivation layer 196, patterning the mask layer to form openings exposing the openings in the passivation layer 196. A conductive layer, such as titanium, copper, nickel, chrome, gold, tungsten, alloys thereof, multilayers thereof, or the like, is then formed over the mask layer and sidewalls and bottoms of the openings in the mask layer and the passivation layer 196. Thereafter, the mask layer and portions of the conductive layer formed thereon are removed, and the remaining portions of the conductive layer form the UBMs 197. Conductive connectors 198 are formed over and electrically coupled to the UBMs 197. The conductive connectors 198 may be a solder ball, a controlled collapse chip connection (C4) bump, a ball grid array (BGA) ball, a micro bump, a copper pillar, or the like, or a combination thereof.

FIGS. 2-5 illustrate cross-sectional views of a semiconductor device structure 200, 300, 400, 500 having a trench capacitor 206, 306, 406, 506, in accordance with some alternative embodiments. The embodiments in FIGS. 2-5 are similar to the embodiment shown in FIG. 1I except that the trench capacitor contains three trenches 102t, and air gaps 203, 303, 403, 503 are formed with different size/dimension. In the embodiments of FIGS. 2-5, the first and second dielectric layers 162, 164 are omitted. In addition, a doped region 104 is further provided in the semiconductor substrate 102. The doped region 104 may be a first doping type (e.g., p-type) and may have a doping concentration higher than semiconductor substrate 102. The doped region 104 is configured to electrically isolate the trench capacitor 206, 306, 406, 506 from other devices disposed within and/or on the semiconductor substrate 102. For the sake of brevity, only elements related to the formation of the air gaps will be discussed.

In FIG. 2, the insulator layer 108 is deposited so that it continuously extends along the front side surface 102f of the semiconductor substrate 102 and along sidewalls of the semiconductor substrate 102 (e.g., openings 107 and extended openings 107' in FIG. 1E) that define the trenches 102t. The trenches 102t are disposed within the doped region 104. The insulator layer 108 continuously extends along sidewalls and an upper surface 101us of each pillar structure 101. A first width w1 of the pillar structure 101 is aligned with the front side surface 102f of the semiconductor substrate 102 and is lesser than a second width w2 of the pillar structure 101. The second width w2 is aligned with a first point 202 that is at vertically beneath the front side surface 102f. The width of the pillar structure 101 continuously increases from the front side surface 102f to the first point 202. The width of the pillar structure 101 continuously decreases from the first point 202 to a second point 204, which is at the bottom of the pillar structure 101 and aligned with the bottom of the trench 102t. The profile of the pillar structure 101 is configured so that a first thickness t1 of the insulator layer 108 is greater than a second thickness t2 of the insulator at the first point 202. In some embodiments, the profile of the pillar structure 101 is configured so that the insulator layer 108 has a third thickness t3 along the upper surface 101us of the pillar structure 101, and the third thickness t3 is greater than the second thickness t2.

By tuning the process conditions, such as the chamber pressure, processing time, and power used during the formation of the trenches 102t (and thus the profile of the pillar structure 101), the angle of the sidewalls of the semiconductor substrate 102 that define the trenches 102t can be adjusted to control the profile of various layers (e.g., insulator layer 108, capacitor electrode layers 110a-d, and the capacitor dielectric layers 112a-d) formed within the trenches 102t. As a result, the size/dimension of the air gap 203 formed within each trench 102t may vary to provide various degrees of the capacitance density for the trench capacitor 206. In some embodiments, the air gap 203 has a dimension D4 which is about 10% of the height D5 of the trench 102t. The height D5 of the trench 102t is measured from the front side surface 102f of the semiconductor substrate 102 to the bottom of the trench 102t.

Figure 5:
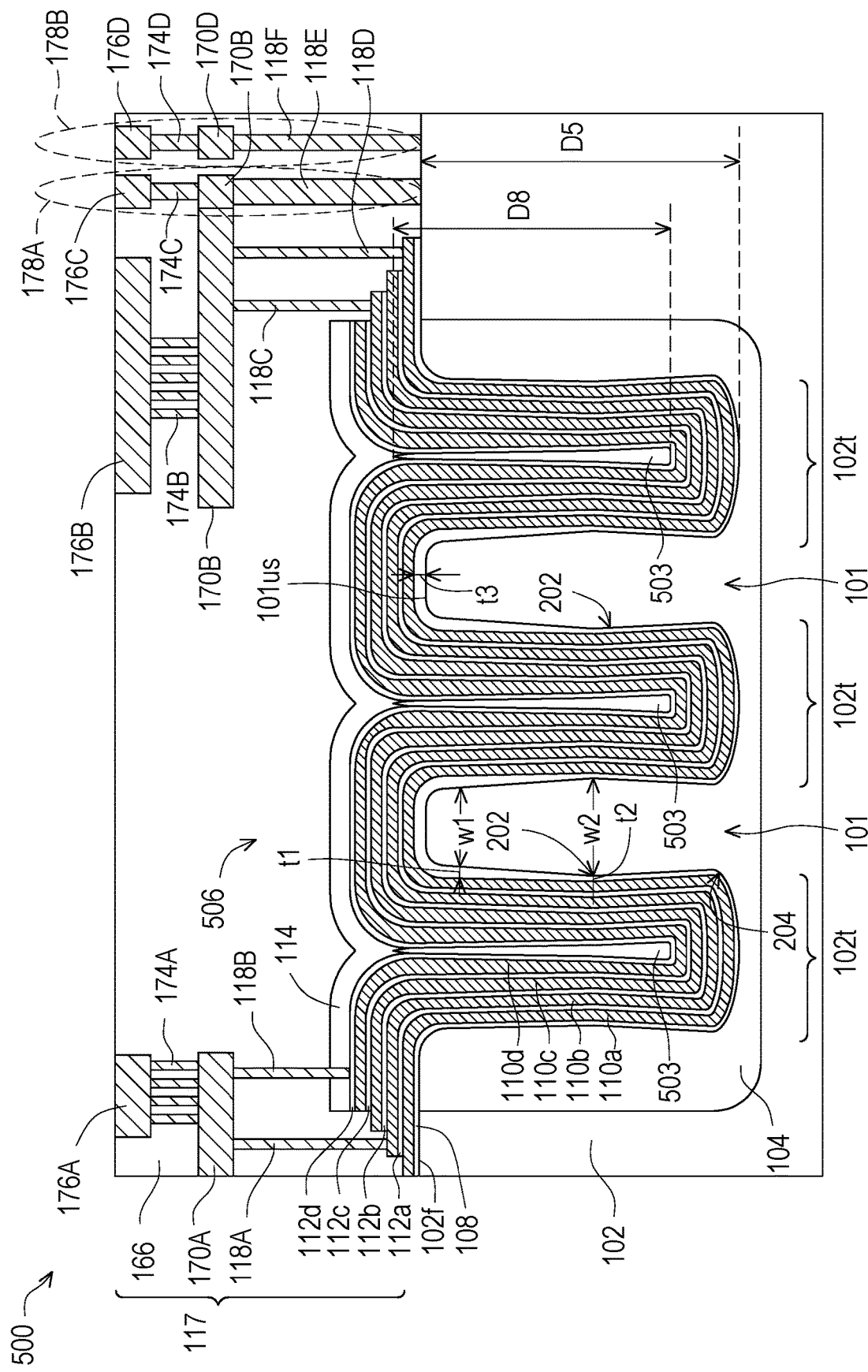

In FIG. 3, the trench capacitor 306 is substantially identical to the trench capacitor 206 except that the dimension D6 of the air gap 303 is about 30% of the height D5 of the trench 102t. In FIG. 4, the trench capacitor 406 is substantially identical to the trench capacitor 206 except that the dimension D7 of the air gap 403 is about 60% of the height D5 of the trench 102t. In FIG. 5, the trench capacitor 506 is substantially identical to the trench capacitor 206 except that the dimension D8 of the air gap 503 is about 98% of the height D5 of the trench 102t.

Figure 6A:
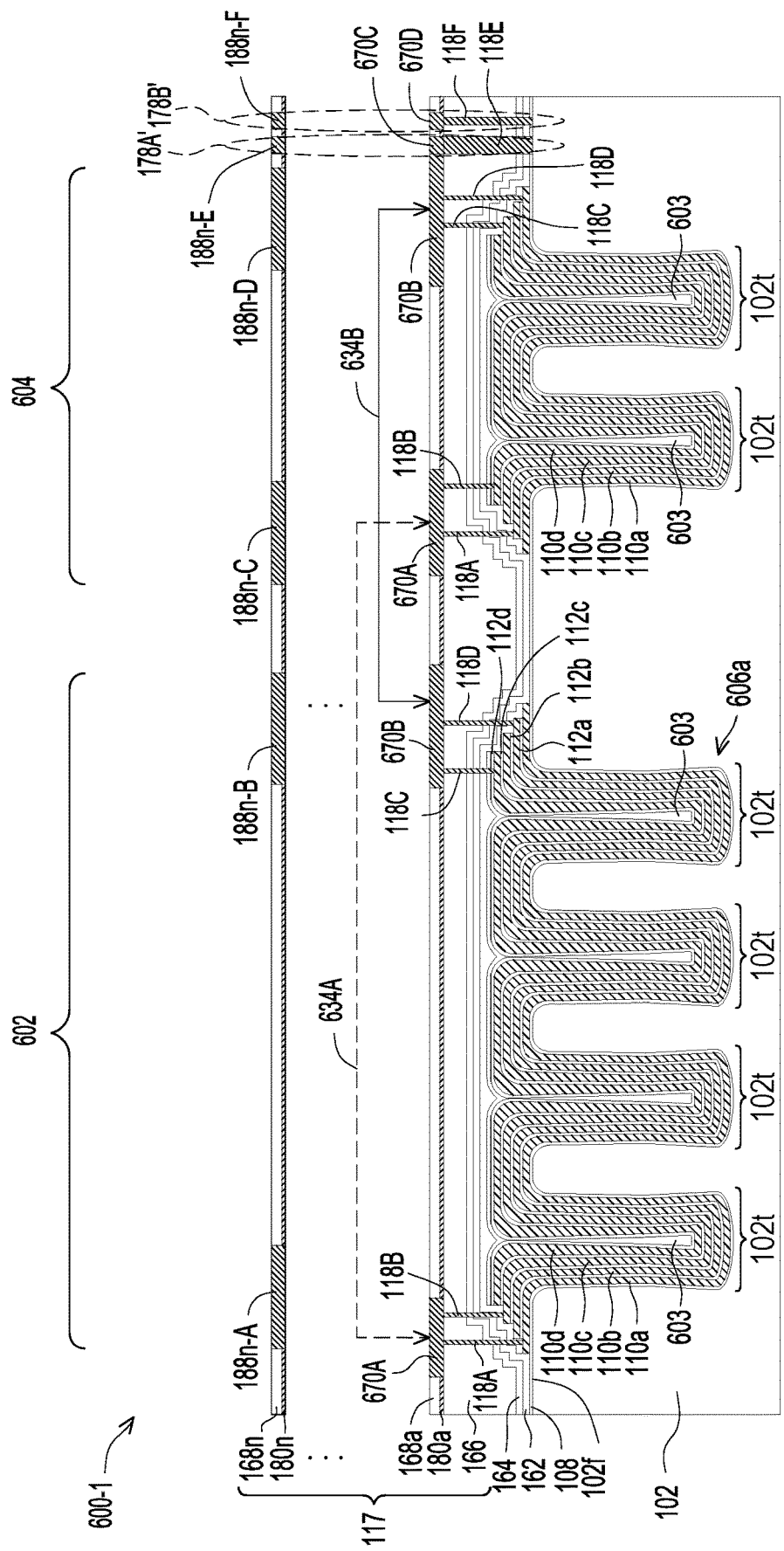
FIG. 6A illustrates a semiconductor device structure with multiple trench capacitors formed in the semiconductor substrate, in accordance with some embodiments.

FIG. 6A illustrates a semiconductor device structure 600-1 with multiple trench capacitors formed in the semiconductor substrate 102. In some embodiments, there is a first trench capacitor 606a in a first region 602 and a second trench capacitor 606b in a second region 604. In one embodiment, the first trench capacitor 606a may include four trenches 102t and the second trench capacitor 606b may include two trenches 102t. However, more or less trenches 102t are contemplated in the first and second regions 602, 604. The first and second trench capacitors 606a, 606b are formed with the similar features as the trench capacitor 106 (FIG. 1I) described above, and may be formed with the trench capacitor 106 simultaneously. Each trench 102t has an air gap 603, which may be formed to have different size such as those shown in FIGS. 2-5. In some embodiments, the two adjacent trench capacitors 606a, 606b are electrically coupled such that the conductive line 670A (e.g., capacitor electrode operating at a higher potential) of the trench capacitor 606a and the conductive line 670C (e.g., capacitor electrode operating at a higher potential) of the trench capacitor 606b are coupled together by line 634A, and the conductive line 670B (e.g., capacitor electrode at a lower potential) of the trench capacitor 606a and the conductive line 670D (e.g., capacitor electrode at a lower potential) of the trench capacitor 606b are coupled together by line 634B. With this configuration, the trench capacitors 606a, 606b are coupled in parallel and can provide a larger effective capacitance as needed for design requirements. In some embodiments, the lines 634A, 634B can be implemented by forming one or more dielectric layers (e.g., IMD layers) with embedded conductive features (e.g., conductive vias/lines) in the interconnect structure 117, as discussed above with respect to FIG. 1I.

Figure 6B:
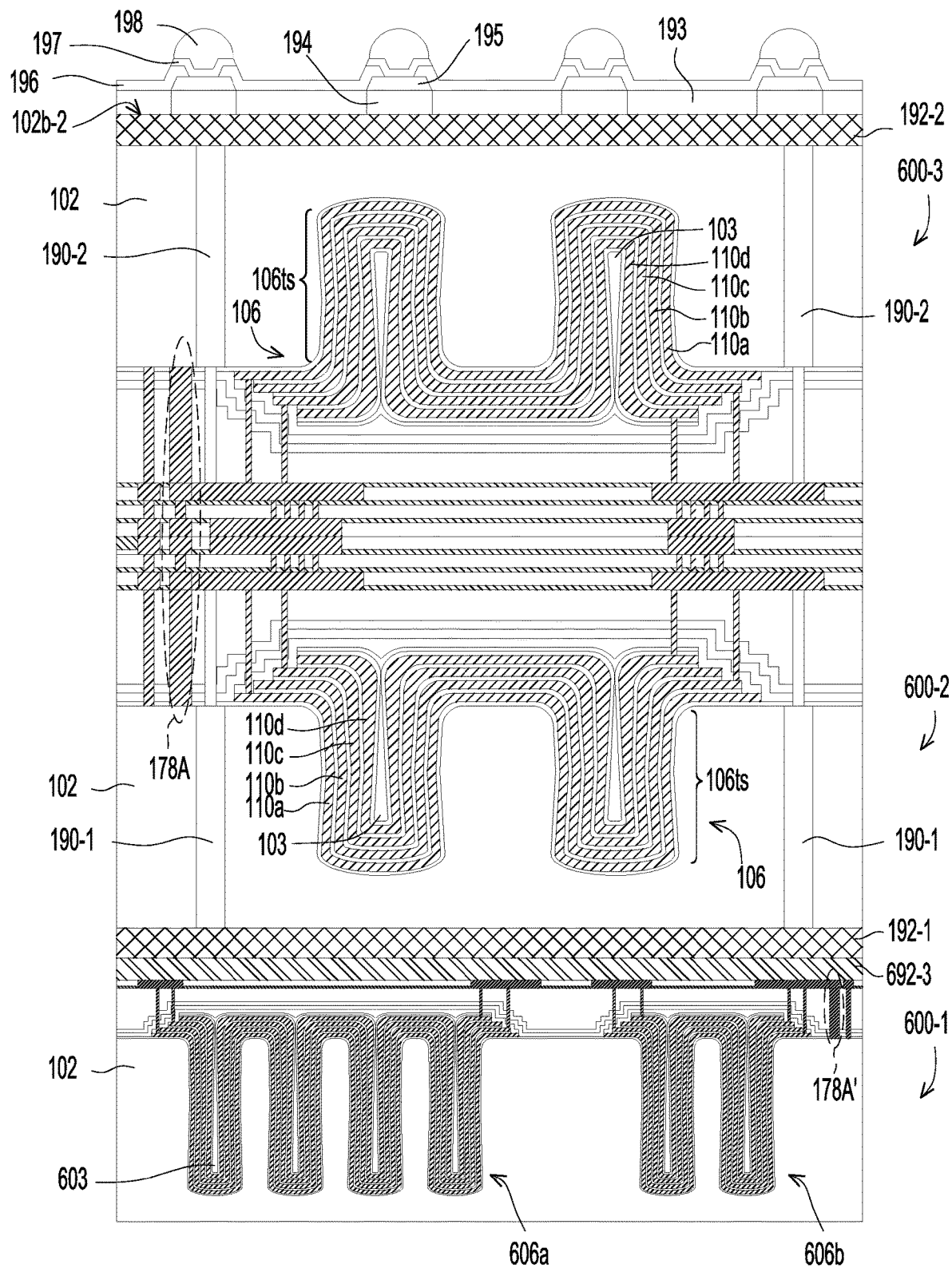
FIG. 6B illustrates a manufacturing stage of the semiconductor device structure of FIG. 6A after bonding to a structure comprising a first semiconductor device structure and a second semiconductor device structure, in accordance with some embodiments.

FIG. 6B illustrates a manufacturing stage of the semiconductor device structure 600-1 of FIG. 6A after bonding to a structure comprising a first semiconductor device structure 600-2 and a second semiconductor device structure 600-3, in accordance with some embodiments. In some embodiments, the first semiconductor device structure 600-2 and the second semiconductor device structure 600-3 may be the first semiconductor device structure 100-1 and the second semiconductor device structure 100-2, respectively, shown in FIG. 1O. For ease of illustration, the features of the first and second semiconductor device structure 600-2, 600-3 will use the reference numerals similar or identical to features of the first and second semiconductor device structures 100-1, 100-2. The semiconductor device structure 600-1 may be boned to the structure of the first and second semiconductor device structure 600-2, 600-3 using any suitable bonding process, such as a hybrid boding process (e.g., dielectric-to-dielectric and metal-to-metal bonding). In such cases, the semiconductor device structure 600-1 and the structure of the first semiconductor device structure 600-2 and the second semiconductor device structure 600-3 are arranged so that a front side of a third RDL 692-3 (e.g., third RDL 192-3) of the semiconductor device structure 600-1 is in contact with the front side of the first RDL 192-1 of the first semiconductor device structure 600-2, thereby allowing power and electrical signals from the semiconductor device structure 600-1 to be distributed to various elements in the first and second semiconductor device structures 600-2, 600-3 through the interconnect structures 117 and the first and second through-hole structures 190-1, 190-2. The embodiment of FIG. 6B allows semiconductor device structures with different number of trench capacitors (e.g., trench capacitors 106, 606a, 606b) to combine and provide enhanced capacitance density. The air gaps 103 within each trench 102t of the semiconductor device structures 600-2, 600-3 may have the same size as the air gaps 603 of the semiconductor device structure 600-1. The air gaps 103, 603 mitigate warpage, cracking, and/or breaking of the semiconductor substrate 102. In addition, each semiconductor device structure 600-1, 600-2, 600-3 has conductive lines (coupled to capacitor electrode operating at a lower potential) connected to and/or in physical contact with the inner seal ring structure 178A, 178A' for discharge of electrostatic charges (or static electricity) from the trench capacitor 106, 606a, 606b to the semiconductor substrate 102, which may be grounded or connected to a signal ground through internal connection (not shown).

Figure 7:
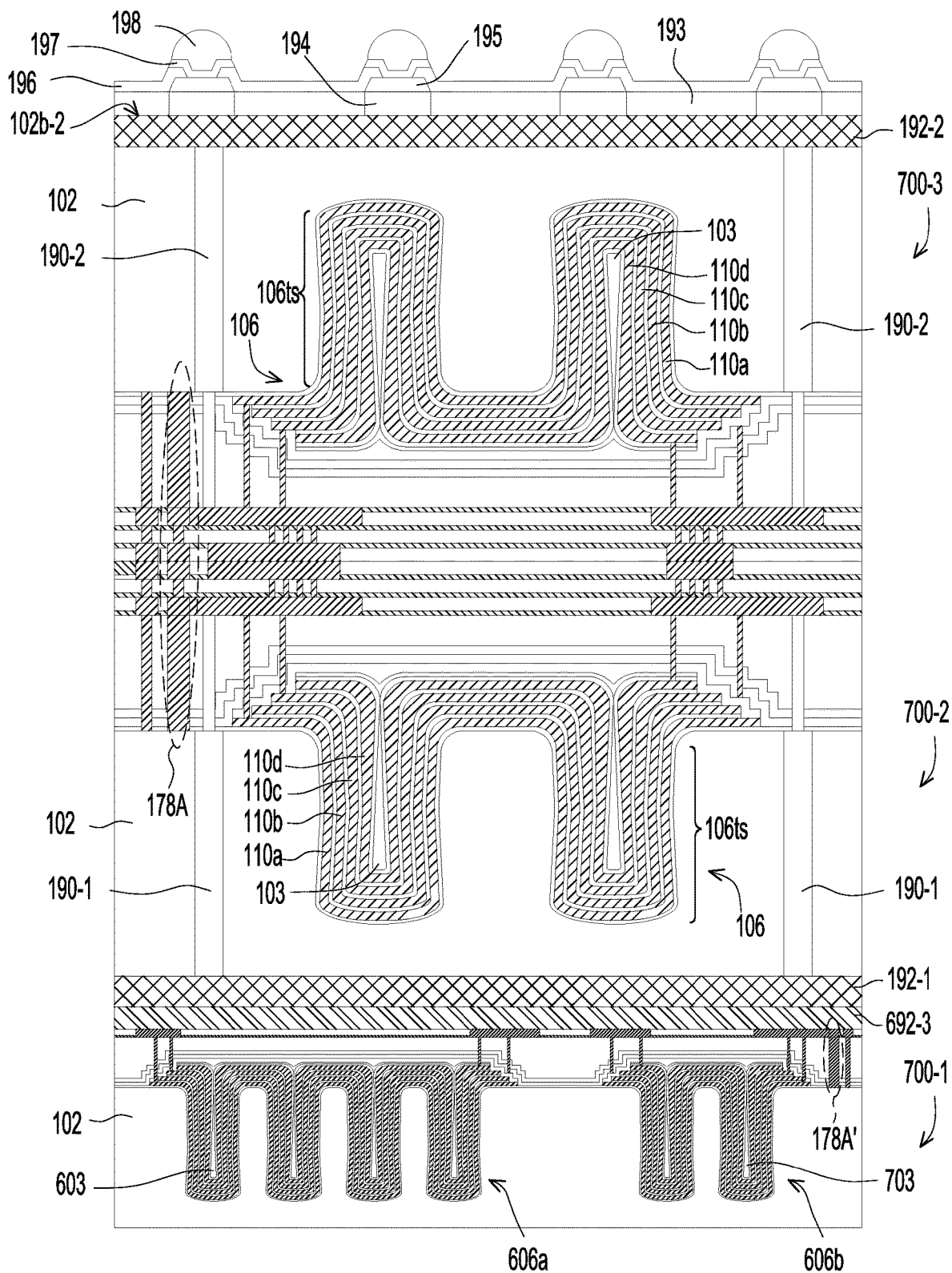
FIGS. 7 and 8 show a multi-wafer structure employing different size of air gaps within the trench capacitor, in accordance with some alternative embodiments.
Figure 8:
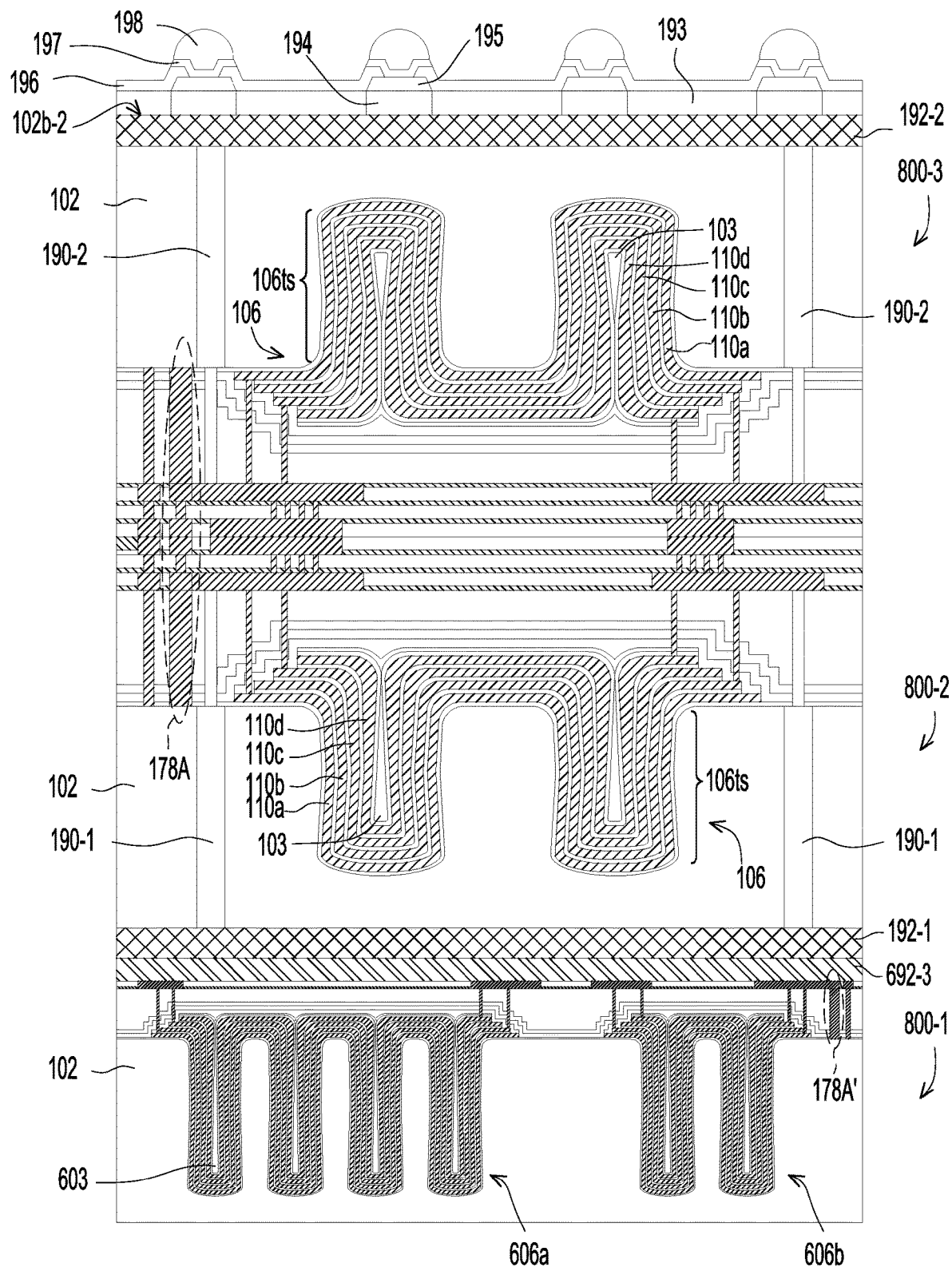

The size of the air gaps in the trench capacitor in a multi-wafer structure may vary depending on the number of the trench capacitor disposed in the semiconductor substrate 102. Various size of air gaps can be adapted by the trench capacitor in different semiconductor device structures to maximize the capacitance density while minimizing warpage or breaking of the semiconductor substrate. FIGS. 7 and 8 show a multi-wafer structure employing different size of air gaps within the trench capacitor, in accordance with some alternative embodiments. FIG. 7 illustrates a manufacturing stage of a first semiconductor device structure 700-1 after bonding to a structure comprising a second semiconductor device structure 700-2 and a third semiconductor device structure 700-3. In some embodiments, the first semiconductor device structure 700-1 may be the semiconductor device structure 600-1 shown in FIG. 6A, and the second semiconductor device structure 700-2 and the third semiconductor device structure 700-3 may be the first semiconductor device structure 100-1 and the second semiconductor device structure 100-2, respectively, shown in FIG. 1O. However, the air gaps 103 within the trench 102t of the second and third semiconductor device structures 700-2, 700-3 have a size greater than the air gaps 703 within the trench 102t of the first semiconductor device structure 700-1. For example, the air gaps 103 may have a size corresponding to the air gaps 403 shown in FIG. 4, and the air gaps 703 may have a size corresponding to the air gaps 303 shown in FIG. 3. Alternatively, the air gaps 103 may have a size corresponding to the air gaps 503 shown in FIG. 5, and the air gaps 703 may have a size corresponding to the air gaps 303 or 404 shown in FIG. 3 or 4.

FIG. 8 illustrates a manufacturing stage of a first semiconductor device structure 800-1 after bonding to a structure comprising a second semiconductor device structure 800-2 and a third semiconductor device structure 800-3, in accordance with some embodiments. In some embodiments, the first semiconductor device structure 800-1 may be the semiconductor device structure 600-1 shown in FIG. 6A, the second semiconductor device structure 800-2 and the third semiconductor device structure 800-3 may be the first semiconductor device structure 100-1 and the second semiconductor device structure 100-2, respectively, shown in FIG. 1O. However, the air gaps 103 within the trench 102t of the second semiconductor device structures 800-2 have a size greater than the air gaps 103 within the trench 102t of the third semiconductor device structure 700-3, and the air gaps 803 within the trench 102t of the first semiconductor device structure 800-1 have a size greater than the air gaps 103 within the trench 102t of the second and third semiconductor device structures 800-2, 800-3. For example, the air gaps 103 within the trench 102t of the second semiconductor device structure 800-2 may have a size corresponding to the air gaps 403 shown in FIG. 4, the air gaps 103 within the trench 102t of the third semiconductor device structure 800-3 may have a size corresponding to the air gaps 303 shown in FIG. 3, and the air gaps 803 may have a size corresponding to the air gaps 503 shown in FIG. 5.

While embodiments in FIGS. 6A-8 show the semiconductor device structure (e.g., semiconductor device structures 600-1, 700-1, 800-1) with a greater number of trenches 102t disposed at the bottom of the structure, such the semiconductor device structure may be disposed at the top of the structure, or between two semiconductor device structures (e.g., semiconductor device structures 600-2 and 600-3, 700-2 and 700-3, or 800-2 and 800-3) with a lesser number of trenches 102t. In latter cases, through-hole structures (e.g., through-hole structures 192-1) can be used in the semiconductor disposed at the middle of the structure to allow distribution of power and electrical signals between various elements of the semiconductor device structures. In addition, the number of trenches 102t in each semiconductor device structure may vary depending on the application and is not limited to the configuration as shown.

Various embodiments of the present disclosure provide trench capacitors with a high capacitance density and low substrate warpage. The trench profile in the trench capacitor is configured so that an air gap is formed within each trench and enclosed by a plurality of capacitor electrode layers and dielectric layers. The air gap may be formed with different dimension to mitigate warpage and/or breaking of a semiconductor substrate in which the trench capacitors are disposed. Conductive line(s) at M1 level of an interconnect structure for the trench capacitor are in physical contact with a seal ring structure to help release electrostatic charges from the trench capacitor. The capacitance density can be further increased through stacking of multiple semiconductor device structures employing the trench capacitors.

An embodiment is a semiconductor device structure. The semiconductor device structure comprises a substrate comprising a first trench, wherein the first trench extends into a front side surface of the substrate, a first trench capacitor comprising a plurality of first capacitor electrode layers and a plurality of first capacitor dielectric layers disposed in alternating manner within the first trench and over the front side surface of the substrate, wherein a first air gap is enclosed by the plurality of first capacitor electrode layers and the plurality of first capacitor dielectric layers within the first trench, an interconnect structure disposed over the first trench capacitor, wherein one or more first capacitor electrode layers of the plurality of first capacitor electrode layers are in electrical connection with a first conductive feature in a dielectric layer of the interconnect structure, and a first seal ring structure disposed in the interconnect structure and encircling an interior portion of the substrate, wherein at least a portion of the first seal ring structure is in contact with the first conductive feature.

Another embodiment is a structure. The structure comprises a first semiconductor device structure, comprising a first substrate comprising a front side, a backside, and a first trench extending from the front side into the first substrate, a first trench capacitor comprising a plurality of first capacitor electrode layers and a plurality of first capacitor dielectric layers disposed in alternating manner within the first trench and over the front side of the first substrate, a first interconnect structure disposed adjacent the first trench capacitor. The first interconnect structure comprises a first dielectric layer and a plurality of first conductive features in the first dielectric layer, wherein one or more first capacitor electrode layers of the plurality of first capacitor electrode layers are in electrical connection with one first conductive feature of the plurality of first conductive features, and a topmost dielectric layer and a plurality of topmost conductive features in the topmost dielectric layer. The structure also includes a second semiconductor device structure, comprising a second substrate comprising a front side, a backside, and a second trench extending from the front side into the second substrate, a second trench capacitor comprising a plurality of second capacitor electrode layers and a plurality of second capacitor dielectric layers disposed in alternating manner within the second trench and over the front side of the second substrate, a second interconnect structure disposed adjacent the second trench capacitor. The second interconnect structure comprises a first dielectric layer and a plurality of first conductive features in the first dielectric layer of the second interconnect structure, wherein one or more second capacitor electrode layers of the plurality of second capacitor electrode layers are in electrical connection with one first conductive feature of the plurality of first conductive features of the second interconnect structure, and a topmost dielectric layer and a plurality of topmost conductive features in the topmost dielectric layer of the second interconnect structure, wherein the topmost dielectric layer of the second interconnect structure is in contact with the topmost dielectric layer of the first interconnect structure, and at least one topmost conductive feature of the second interconnect structure is in contact with at least one topmost conductive feature of the first interconnect structure.

A further embodiment is a method for forming a structure, comprising forming a first semiconductor device structure by forming a trench in a substrate and defining a pillar structure abutting the trench, wherein an upper portion of the trench has a first dimension decreasing from a first width to a second width smaller than the first width, and a lower portion of the trench has a second dimension increasing from the second width to a third width greater than the second width, depositing alternatingly a plurality of capacitor electrode layers and a plurality of capacitor dielectric layers within the trench and over the front side surface of the substrate, wherein an air gap is sealed within the trench by sidewalls of an uppermost capacitor dielectric layer, and forming an interconnect structure over the trench, wherein a first conductive feature of a dielectric layer of the interconnect structure is in electrical connection with one or more capacitor electrode layers of the plurality of capacitor electrode layers, and that a second conductive feature in the dielectric layer encircles an interior portion of the substrate and in contact with the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
a substrate comprising a first trench and a second trench, wherein the first trench and the second trench extend into a front side surface of the substrate;
a first trench capacitor comprising a plurality of first capacitor electrode layers and a plurality of first capacitor dielectric layers disposed in alternating manner within the first trench and over the front side surface of the substrate, wherein the plurality of first capacitor electrode layers and the plurality of first capacitor dielectric layers enclose a first air gap within the first trench;
a second trench capacitor comprising a plurality of second capacitor electrode layers and a plurality of second capacitor dielectric layers disposed in alternating manner within the second trench and over the front side surface of the substrate, wherein the plurality of second capacitor electrode layers and the plurality of second capacitor dielectric layers enclose a second air gap within the second trench;
an interconnect structure disposed over the first trench capacitor and the second trench capacitor, wherein,
one or more first capacitor electrode layers of the plurality of first capacitor electrode layers are in electrical connection with a first conductive feature in a dielectric layer of the interconnect structure,
one or more second capacitor electrode layers of the plurality of second capacitor electrode layers are in electrical connection with a second conductive feature in the dielectric layer of the interconnect structure, and
the first conductive feature and the second conductive feature are coupled together by a conductive line of the interconnect structure; and
a first seal ring structure disposed in the interconnect structure and encircling an interior portion of the substrate, wherein the first conductive feature and the second conductive feature are coupled to the first seal ring structure, and at least a portion of the first seal ring structure is in contact with the first conductive feature.

2. The semiconductor device structure of claim 1, further comprising:
a pillar structure disposed within the substrate and abutting the first trench, the pillar structure comprising:
an upper portion having a first dimension gradually increasing from a first width to a second width; and
a lower portion having a second dimension gradually decreasing from the second width to a third width.

3. The semiconductor device structure of claim 2, wherein the first width is greater or lesser than the third width.

4. The semiconductor device structure of claim 2, wherein a sidewall of the upper portion of the pillar structure and the front side surface of the substrate form an angle of about 92 degrees or greater.

5. The semiconductor device structure of claim 1, wherein the first air gap has a first dimension and the first trench has a second dimension measuring from the front side surface of the substrate to a bottom of the first trench, and the first dimension is about 10% to about 98% of the second dimension.

6. The semiconductor device structure of claim 1, wherein the first seal ring structure is in contact with the front side surface of the substrate, and the substrate is grounded or connected to a signal ground.

7. The semiconductor device structure of claim 6, further comprising:
a second seal ring structure surrounding the first seal ring structure, wherein the second seal ring structure is electrically isolated from the first conductive feature.

8. The semiconductor device structure of claim 1, wherein one or more capacitor electrode layers of the plurality of capacitor electrode layers are connected to a third conductive feature in the dielectric layer, and the third conductive feature is floating and electrically isolated from the first seal ring structure.

9. The semiconductor device structure of claim 1, wherein at least a portion of the first seal ring structure is in contact with the second third conductive feature.

10. A semiconductor device structure, comprising:
a substrate comprising a front side and a backside opposing the front side;
a first trench and a second trench extending from the front side into the substrate;
a first trench capacitor, comprising:
a plurality of first capacitor electrode layers; and
a plurality of first capacitor dielectric layers disposed in alternating manner with the plurality of first capacitor electrode layers within the first trench and over the front side of the substrate, wherein one of the plurality of first capacitor dielectric layers defines a first air gap therein;
a second trench capacitor, comprising:
a plurality of second capacitor electrode layers; and
a plurality of second capacitor dielectric layers disposed in alternating manner with the plurality of second capacitor electrode layers within the second trench and over the front side of the substrate, wherein one of the plurality of second capacitor dielectric layers defines a second air gap therein;
an interconnect structure disposed adjacent the first trench capacitor and the second trench capacitor, comprising:
a first intermetal dielectric (IMD) layer;
a first conductive line in the first IMD layer;
a first conductive via connecting a first capacitor electrode layer of the plurality of first capacitor electrode layers to the first conductive line;
a second conductive line in the first IMD layer;
a second conductive via connecting a second capacitor electrode layer of the plurality of second capacitor electrode layers to the second conductive line; and
a third conductive line, wherein the first conductive line and the second conductive line are coupled together by the third conductive line; and
a first seal ring structure extending through the thickness of the interconnect structure and being arranged to surround the first trench and the second trench, wherein the first conductive line and the second conductive line are coupled to the first seal ring structure.

11. The semiconductor device structure of claim 10, further comprising:

an insulator layer disposed between the substrate and the one of the plurality of first capacitor electrode layers.

12. The semiconductor device structure of claim 11, wherein the first seal ring structure extends through the insulator layer and in contact with a front side surface of the substrate.

13. The semiconductor device structure of claim 11, wherein the first conductive line is in contact with a portion of the first seal ring structure.

14. The semiconductor device structure of claim 10, further comprising:
a second seal ring structure surrounding the first seal ring structure, wherein the first seal ring structure and the second seal ring structure are electrically isolated from each other.

15. The semiconductor device structure of claim 11, further comprising:
a third trench extending from the front side into the substrate;
a third trench capacitor, comprising:
the plurality of first capacitor electrode layers; and
the plurality of first capacitor dielectric layers disposed in alternating manner with the plurality of first capacitor electrode layers within the third trench and over the front side of the substrate, wherein one of the plurality of first capacitor dielectric layers defines a third air gap therein.

16. The semiconductor device structure of claim 15, wherein the interconnect structure further comprises:
a third conductive line in the first IMD layer; and
a third conductive via connecting a third capacitor electrode layer of the plurality of first capacitor electrode layers to the third conductive line.

17. The semiconductor device structure of claim 16, wherein the first capacitor electrode layer is directed to operate at a first potential, and the third capacitor electrode layer is directed to operate at a second potential greater than the first potential.

18. A semiconductor device structure, comprising:
a substrate comprising a front side and a backside opposing the front side;
a first trench extending from the front side into the substrate;
a second trench extending from the front side into the substrate;
a plurality of first capacitor electrode layers;
a plurality of first capacitor dielectric layers disposed in alternating manner with the plurality of first capacitor electrode layers within the first and second trenches and over the front side of the substrate;
a pillar structure disposed between the first trench and the second trench, wherein the pillar structure has an upper profile gradually increasing from a first dimension to a second dimension, and a lower profile gradually decreasing from the second dimension to a third dimension;
a third trench extending from the front side into the substrate;
a plurality of second capacitor electrode layers;
a plurality of second capacitor dielectric layers disposed in alternating manner with the plurality of second capacitor electrode layers within the third trenches and over the front side of the substrate;
an interconnect structure disposed over the front side of the substrate, wherein,
one or more first capacitor electrode layers of the plurality of capacitor electrode layers are in electrical connection with a first conductive feature in an intermetal dielectric (IMD) layer of the interconnect structure,
one or more second capacitor electrode layers of the plurality of second capacitor electrode layers are in electrical connection with a second conductive feature in the intermetal dielectric layer of the interconnect structure, and
the first conductive feature and the second conductive feature are coupled together by a conductive line of the interconnect structure; and
a first seal ring structure disposed in the interconnect structure and being arranged to encircle the first, second, and third trenches, wherein the first conductive feature and the second conductive feature are coupled to the first seal ring structure, and at least a portion of the first seal ring structure is in contact with the first conductive feature.

19. The semiconductor device structure of claim 18, wherein the plurality of first capacitor electrode layers and the plurality of first capacitor dielectric layers are arranged so that the innermost first capacitor dielectric layer encloses a first air gap in the first trench and a second air gap in the second trench, respectively.

20. The semiconductor device structure of claim 18, further comprising:
a second seal ring structure surrounding the first seal ring structure, wherein the first seal ring structure and the second seal ring structure are electrically isolated from each other.

* * * * *